(12) United States Patent
Athavale et al.

(10) Patent No.: US 7,266,743 B2
(45) Date of Patent: *Sep. 4, 2007

(54) COMBINATORIAL AT-SPEED SCAN TESTING

(75) Inventors: Atul S. Athavale, Chandler, AZ (US); Jason R. Ng, Hacienda Heights, CA (US)

(73) Assignee: Intel Corporation, Santa Clara, CA (US)

( * ) Notice: Subject to any disclaimer, the term of this patent is extended or adjusted under 35 U.S.C. 154(b) by 68 days.

This patent is subject to a terminal disclaimer.

(21) Appl. No.: 11/166,432

(22) Filed: Jun. 23, 2005

(65) Prior Publication Data

US 2006/0107145 A1    May 18, 2006

Related U.S. Application Data

(63) Continuation-in-part of application No. 10/955,615, filed on Sep. 30, 2004.

(51) Int. Cl.
*G01R 31/28* (2006.01)
*G06F 11/00* (2006.01)

(52) U.S. Cl. .............. 714/727; 714/726; 714/733; 714/738

(58) Field of Classification Search ............... None
See application file for complete search history.

(56) References Cited

U.S. PATENT DOCUMENTS

| | | | | |
|---|---|---|---|---|
| 5,281,864 A | * | 1/1994 | Hahn et al. ............... | 327/202 |
| 5,592,493 A | * | 1/1997 | Crouch et al. ............ | 714/729 |
| 6,000,051 A | * | 12/1999 | Nadeau-Dostie et al. ... | 714/727 |
| 6,779,142 B1 | * | 8/2004 | Bhavsar et al. ............ | 714/726 |
| 6,961,885 B2 | * | 11/2005 | Man et al. ................. | 714/727 |
| 6,988,232 B2 | * | 1/2006 | Ricchetti et al. ........... | 714/736 |
| 2003/0084413 A1 | | 5/2003 | Varney | |
| 2003/0093734 A1 | | 5/2003 | Zhang et al. | |
| 2004/0064769 A1 | | 4/2004 | Gupte et al. | |
| 2004/0267480 A1 | * | 12/2004 | Day ......................... | 702/117 |

OTHER PUBLICATIONS

Samaranayake, S. et al., "Dynamic Scan: Driving Down the Cost of Test," IEEE, vol. 35, No. 10, Oct. 2002, pp. 63-68.
Neil, Bob, "How to generate at-speed scan vectors," EE design, May 9, 2003. URL: http://www.eedesign.com/article/showArticle.jhtml?articleId=17408375.
Lin, X. et al., "High-Frequency, At-Speed Scan Testing," IEEE, vol. 20, No. 5, Sep./Oct. 2003, pp. 17-25.
Swanson, B. et al., "At-speed testing made easy," EE design, Jun. 3, 2004. URL: http://www.eedesign.com/article/showArticle.jhtml?articleId=21401421.

* cited by examiner

*Primary Examiner*—Phung My Chung
(74) *Attorney, Agent, or Firm*—Blakely, Sokoloff, Taylor & Zafman LLP

(57) ABSTRACT

A processor including a first distributed shift generator associated with a first time domain, wherein the first distributed shift generator is coupled to a first group of scan chains, the first distributed shift generator to send a shift-enable-flop signal to be received by the first group of scan chains. The processor including a second distributed shift generator associated with a second time domain, wherein the second distributed shift generator is coupled to a second group of scan chains, the second distributed shift generator to send a shift-enable-flop signal to be received by the second group of scan chains. The processor including a scan test controller coupled to the first and second distributed shift generators, the scan test controller to provide clocking signals for the first time domain and the second time domain for performing an at-speed test of circuits coupled to the first group of scan chains.

19 Claims, 24 Drawing Sheets

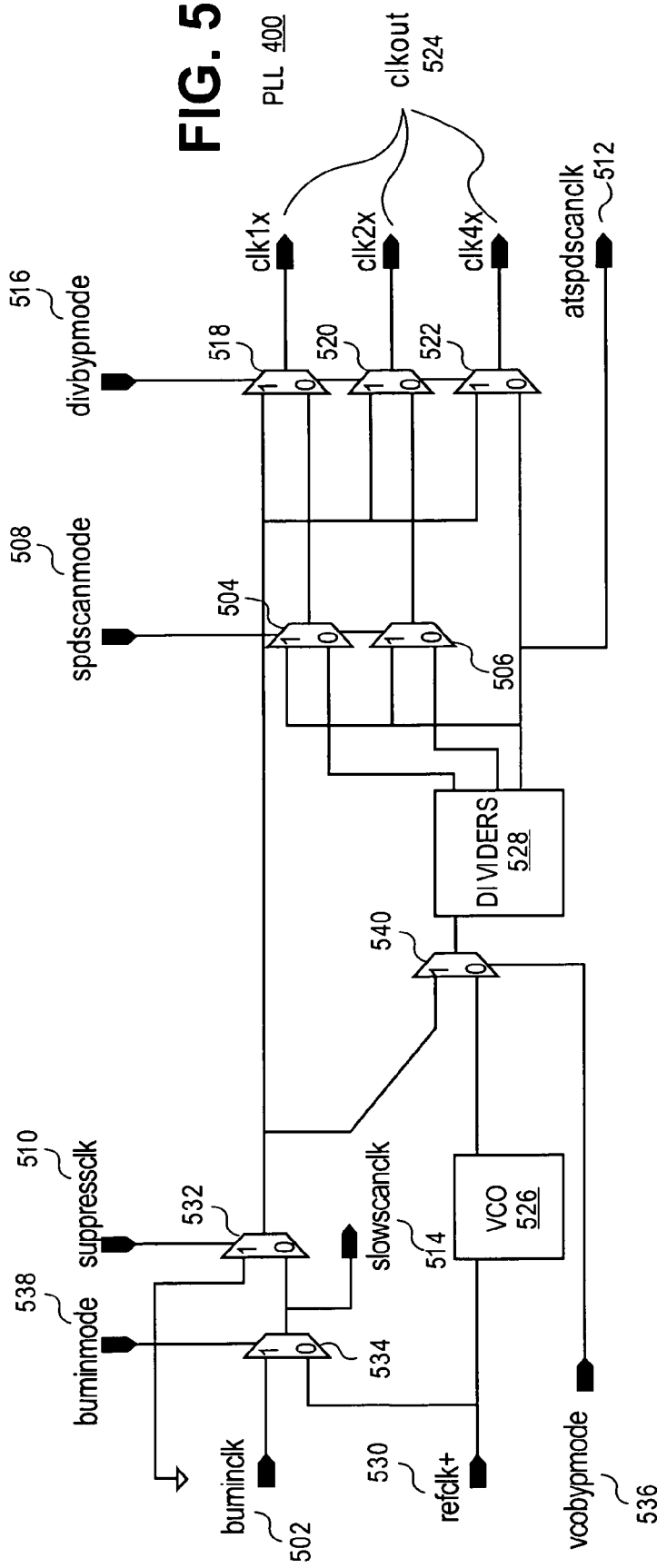
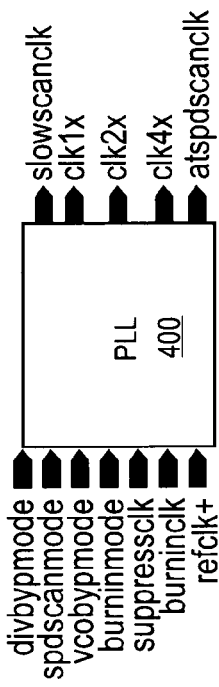

PLL 2200

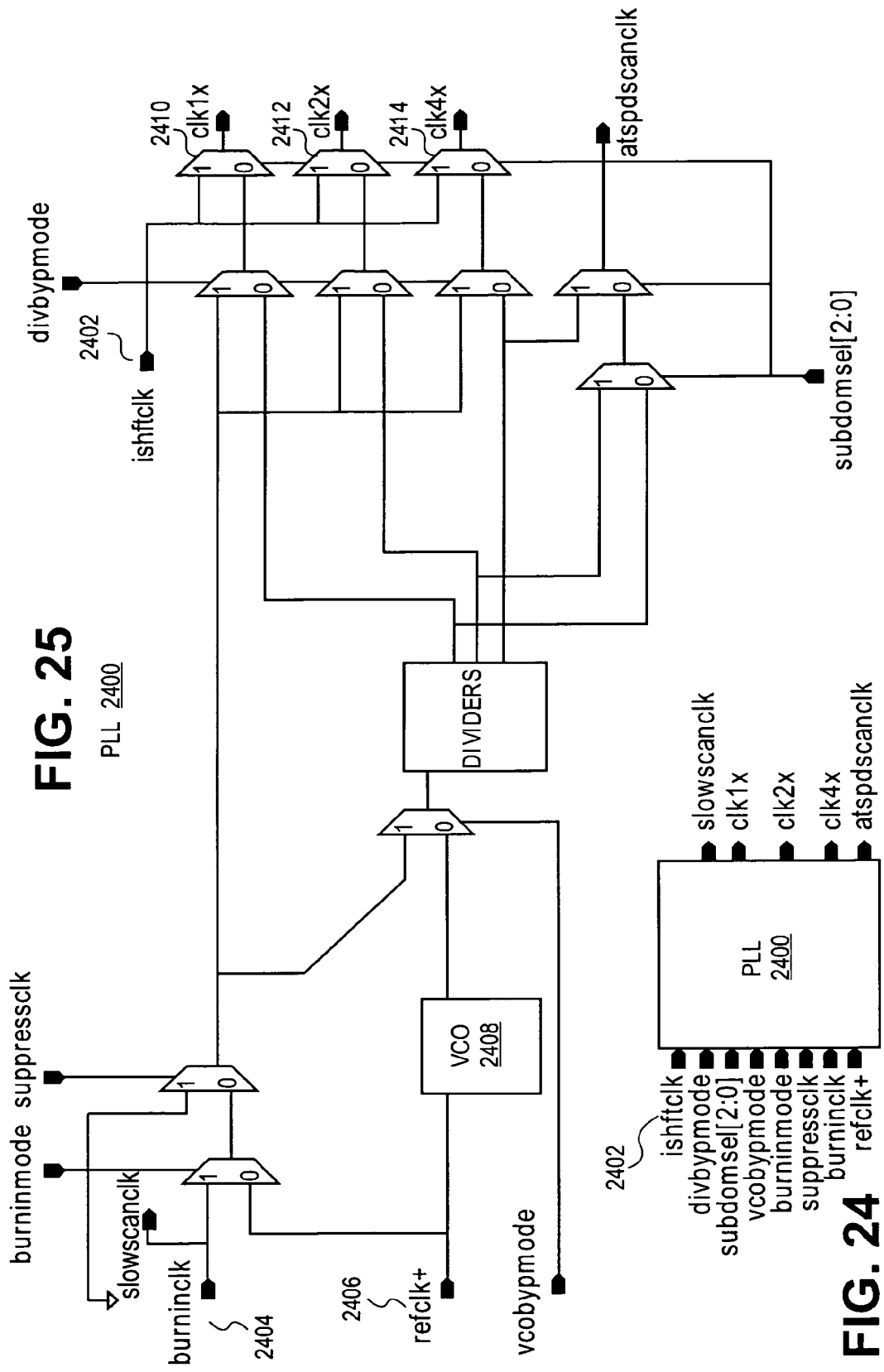

COMBINATORIAL AT-SPEED SCAN TESTING

CROSS-REFERNCE TO RELATED APPLICATIONS

This application is a continuation-in-part of prior U.S. patent application Ser. No. 10/955,615, filed Sep. 30, 2004.

BACKGROUND

1. Field

Embodiments of the invention relate to the field of system testing and more specifically, but not exclusively, to combinatorial at-speed scan testing.

2. Background Information

Automatic test pattern generation (ATPG) systems use tools for testing digital circuits after the circuits have been manufactured. In general, an ATPG tool generates a set of test vectors that are applied to a circuit under test. The output of the circuit is analyzed to identify logic faults in the circuit design (a.k.a. "functional testing") as well as detecting fabrication defects (a.k.a., "structural testing").

At-speed testing refers to testing techniques to detect defects that are only apparent when the circuit is running at system speed. Many time-based defects cannot be detected unless the circuit is run at-speed. Time related defects that occur at-speed include high impedance shorts, in-line resistance, and cross talk between signals.

Two fault models used in at-speed testing are path-delay fault modeling and transition fault modeling. In general, fault modeling is the translation of physical defects in the circuit to a mathematical construct that can be understood and manipulated by testing software. Path-delay fault modeling tests the combined delay through a predetermined set of logic gates. Transition fault modeling models a gross delay at every logic gate terminal. Transition faults include slow-to-rise and slow-to-fall delays at a gate terminal.

At-speed scan testing for path-delay fault modeling and transition fault modeling involve similar procedures. In general, a test pattern is loaded into a scan chain. The test pattern is launched into the circuit under test and the results captured by a single or a pair of at-speed clock pulses. And then the results of the test pattern are shifted out of the scan chain.

Two types of transition fault modeling are launch-off-shift and broadside. In the launch-off-shift technique, the last shift of the scan chain load also serves as the launch event. This last shift and the capture are skewed close together to produce an at-speed launch-to-capture clock frequency. Launch-off-shift has the advantage of only needing an ATPG tool to create combinatorial test vectors that are quick and easy to create. But the scan chains are shifted at-speed that may contribute to yield loss.

In the broadside approach, the entire scan chain is shifted at slow speed and then a pair of at-speed pulses are used for launch and capture. The results can then be shifted out at slow speed. Thus, broadside does not require the scan chains to shift at-speed, as in launch-off-shift. However, the ATPG pattern must be sequential, which increases the test pattern generation time and may result in higher pattern count. Sequential patterns are more complicated than combinatorial because the ATPG tool has to plan one cycle ahead to account for the fact that data captured in the first cycle is overwritten by data captured in the second cycle.

As integrated circuits becoming smaller and faster, current at-speed testing techniques may fail to detect circuit defects. A failure to detect such defects increases the defects per million (DPM) of a processor. Too many undetected time-based defects directly impacts the quality of products delivered to customers.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 4 is a block diagram illustrating one embodiment of a phase-locked loop in accordance with the teachings of the present invention.

FIG. 5 is a block diagram illustrating one embodiment of a phase-locked loop in accordance with the teachings of the present invention.

FIG. 24 is a block diagram illustrating one embodiment of a PLL in accordance with the teachings of the present invention.

FIG. 25 is a block diagram illustrating one embodiment of a PLL in accordance with the teachings of the present invention.

DETAILED DESCRIPTION

In the following description, numerous specific details are set forth to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
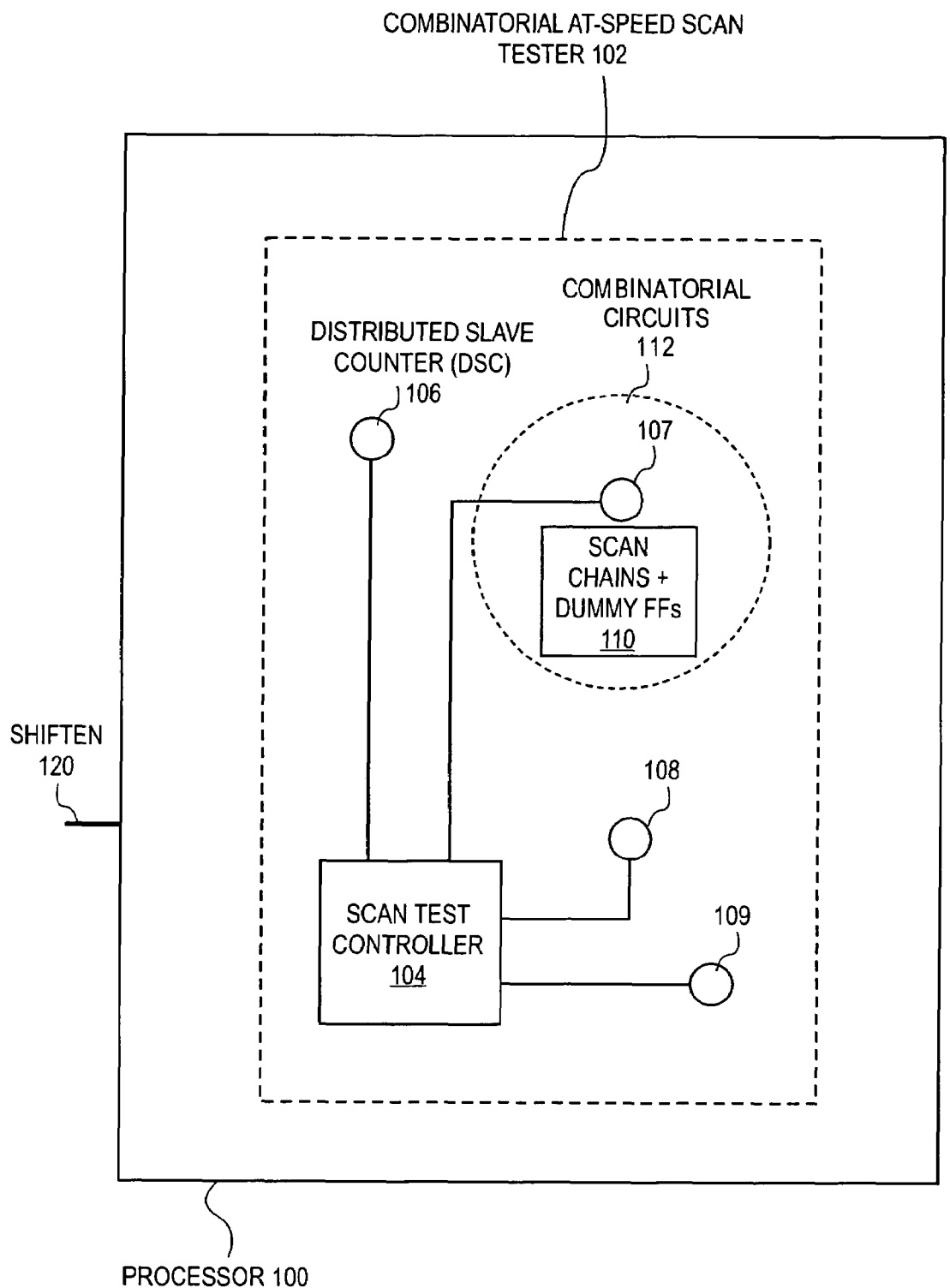
FIG. 1 is a block diagram illustrating one embodiment of a combinatorial at-speed scan tester in accordance with the teachings of the present invention.

Referring to FIG. 1, one embodiment of a processor 100 is shown. In one embodiment, processor 100 includes a memory controller. In another embodiment, processor 100 is part of a "Northbridge" of an Intel® Corporation chipset, also referred to as a Memory Controller Hub (MCH).

Processor 100 includes an embodiment of a combinatorial at-speed scan tester 102. Tester 102 includes a scan test controller 104 coupled to distributed slave counters (DSCs) 106-109. In the embodiment of FIG. 1, DSC 107 may be used to test combinatorial circuits 112. Combinatorial circuits 112 may be coupled to positive and negative clock edge triggered consumer flip-flops (FFs) to be used as storage elements on processor 100 during normal operations. During testing, the consumer FFs may be configured as shift registers for testing combinatorial circuits 112 and for testing the normal storage mode of the consumer FFs themselves. While embodiments described herein refer to flip-flops, it will be understood that other types of storage cells may be used. Further, embodiments herein describe signals as active to refer to logic state '1' and describe signals as inactive to refer to logic state '0'.

Each DSC 106-109 may test combinatorial circuits 112 that are within proximity of the DSC. The number of DSCs may be balanced against the amount of real estate consumed by the DSCs on the die. For example, in one embodiment, if processor 100 includes 1 million consumer FFs, then processor 100 may include 10 DSCs, where each DSC works with 100,000 consumer FFs.

Embodiment of combinatorial at-speed scan tester 102 may provide distributed control of a shift enable (shiften) signal for capturing at-speed scan tests. A slow-speed clock is used to load a scan chain of consumer FFs. A "window" is opened where the slow-speed clock signal is masked and two fast-speed clock pulses pass to the consumer FFs for at-speed testing. The first at-speed clock pulse, which is also the last-shift clock pulse, launches the test pattern and the second at-speed clock pulse captures the results at the scan chain. This "window" is closed and the slow-speed clock signal is used to shift out the at-speed scan test results. In one embodiment, the "window" is generated at each DSC and is synchronized from the scan test controller 104. The selection between the slow-speed clock and the at-speed clock is referred herein as "clock multiplexing."

In embodiments of combinatorial at-speed can tester 102, the opening and closing of the window is tied to an on-board at-speed clock of tester 102. In this particular embodiment, a change in the at-speed clock inherently adjusts the timing and size of the window. Thus, combinatorial at-speed can tester 102 may be scaled to a desired at-speed clock speed without creating control and coordination problems with the generation of the at-speed capture "window."

Embodiments of combinatorial at-speed scan tester 102 may be used to provide at-speed testing with legacy ATPG tools. As will be described below, the ATPG tools may generate test vectors at slow speed, but the launch and capture pulses may be applied at-speed. The ATPG tools will record the results of the test as if the test was performed at slow speed as expected by the ATPG tools. However, a user of the ATPG tools will know that the at-speed test occurred. Embodiments herein allow the use of combinatorial ATPG patterns without significant design overhead. Further, the same ATPG patterns may be used for slow-speed testing as well as at-speed testing.

In one embodiment, dummy FFs 110 are placed at the beginning of each scan chain. As will be described further below, dummy FFs 110 may be used to remove possible corruption of primary values of the first FF in the scan chain so that embodiments of the invention may be used with legacy ATPG tools.

In one embodiment, processor 100 includes a shift enable (shiften) pin 120. Shiften 120 may be used to receive a shift signal from an external source for shifting data in/out of the scan chains. However, shiften 120 is intercepted by the scan test controller 104. Scan test controller 104 coordinates shift timing so that each DSC will pass a shift enable FF (shiften_flop) signal onto their respective scan chains. Shiften_flop mimics shiften 120 except during the at-speed window (discussed further below). The generation of a shiften_flop at each DSC reduces the propagation delay problems associated with using a single external shiften for all consumer FFs and their associated scan chains.

Figure 2A:
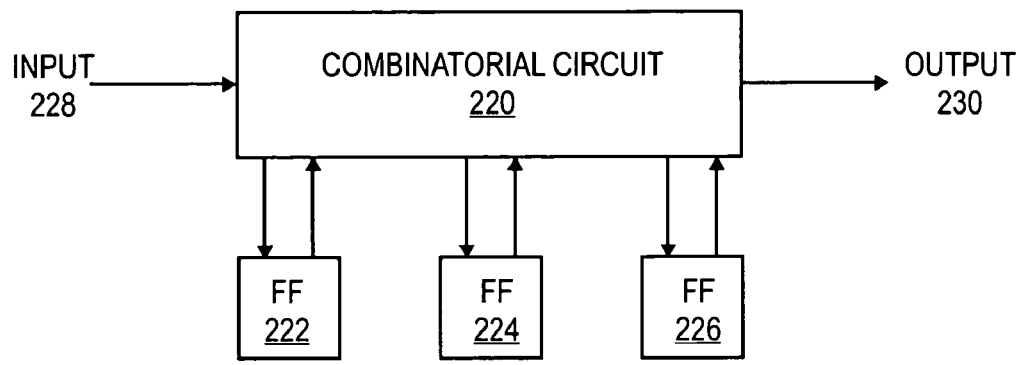
FIG. 2A is a block diagram illustrating one embodiment of a combinatorial at-speed scan tester in accordance with the teachings of the present invention.

Referring to FIG. 2A, an embodiment of a combinatorial circuit 220 is shown. Combinatorial circuit 220 includes input 228 and output 230. Combinatorial circuit 220 is coupled to consumer FFs 222, 224, and 226. During a functional mode, the consumer FFs act as storage cells for use by combinatorial circuit 220.

Figure 2B:
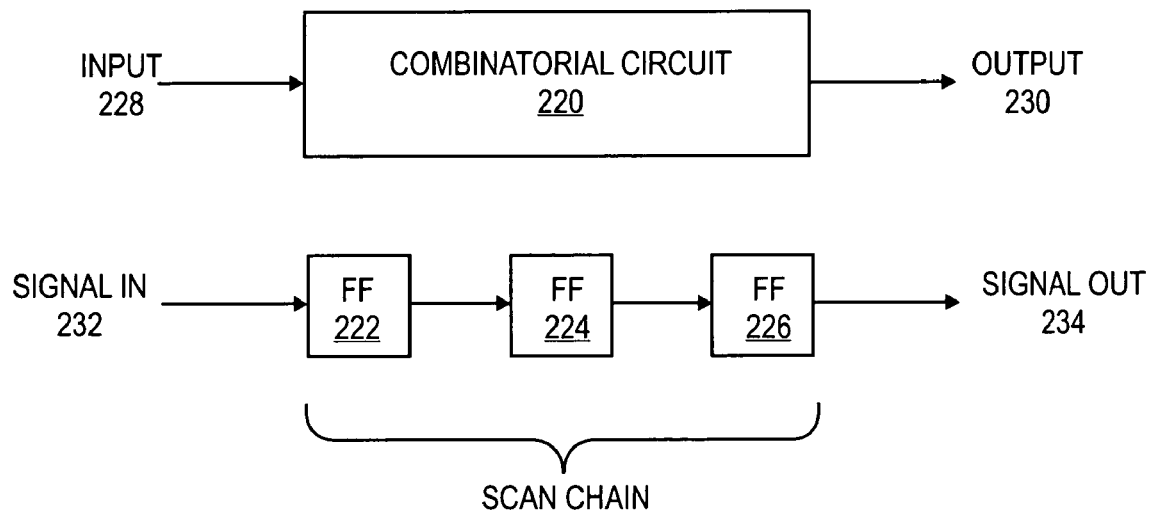
FIG. 2B is a block diagram illustrating one embodiment of a combinatorial at-speed scan tester in accordance with the teachings of the present invention.

In FIG. 2B, the consumer FFs 222, 224, and 226 are in a test mode where a test vector may be shifted in at signal-in 232 and shifted out at signal-out 234. Consumer FFs 222, 224, and 226 form scan chain 236. The test vector is launched into combinatorial circuit 220 from scan chain 236 and the results are captured at scan chain 236. In one embodiment, the storage dependability of consumer FFs 222, 224, and 226 may also be tested. As described further below, scan chain 236 may also include a dummy FF (not shown) in accordance with embodiments described herein.

Figure 2C:
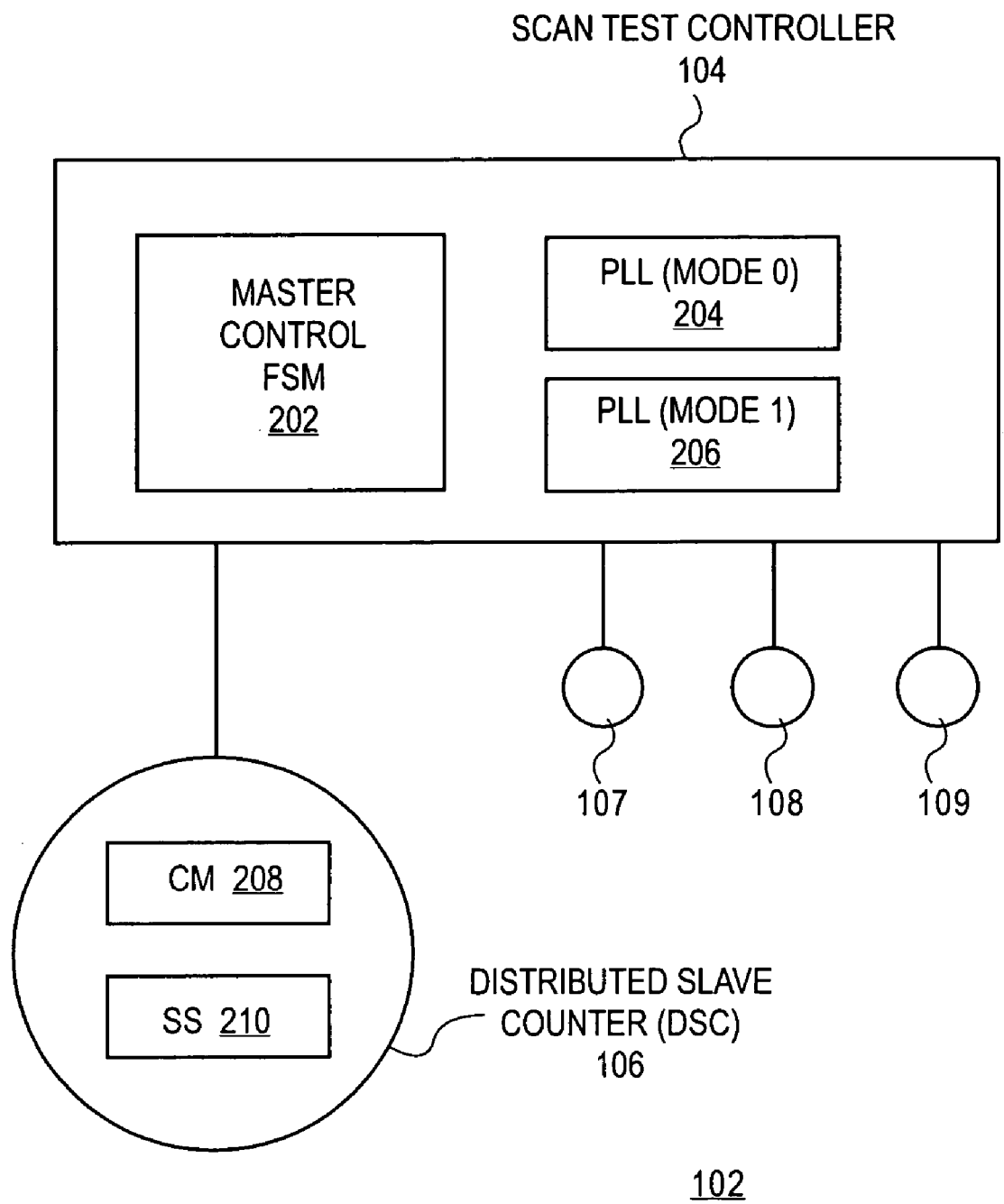
FIG. 2C is a block diagram illustrating one embodiment of a combinatorial at-speed scan tester in accordance with the teachings of the present invention.

Turning to FIG. 2C, an embodiment of combinatorial at-speed scan tester 102 is shown. Scan test controller 104 includes a master control finite state machine (FSM) 202 and a phase lock loop (PLL) 204 associated with mode 0 and PLL 206 associate with mode 1.

Embodiments of the invention may include two or more asynchronous clock domains. Each clock domain may be driven by its own PLL. Different time domains are described herein as "modes." Embodiments herein are described using mode 0 and mode 1, however, it will be understood that alternative embodiments may include one mode or more than two modes.

DSC 106 includes a counter module (CM) 208 and a synchronization/shift generator module (SS) 210. Embodiments of DSCs 107-109 may also each include a CM and a SS.

In one embodiment, ATPG vectors are clock restricted to ensure that all except one asynchronous clock domain suppress the scan capture pulse. In this embodiment, to test multiple clock domains, ATPG vectors for each clock domain are to be used.

In another embodiment, most of the consumer FFs are at a single operating frequency serviced by a single clock tree.

In another embodiment, other clock trees may exist with a single time domain. In one implementation of this particular embodiment, additional processor pins and different ATPG vectors may be used. In another implementation, additional logic may be added to the design to enable a last-shift to reach multiple clock trees in the domain under test, but the capture clock pulse only reaches the scan chains of the clock tree under test within the domain under test (discussed below in conjunction with FIGS. 22-25).

In one embodiment, scan chains may not cross their clock domain boundary. Further, in another embodiment, scan chains may not cross common frequency boundaries within a clock domain. In alternative embodiments, the scan chains may cross clock domains as long as setup and hold timing issues are designed out.

Figure 3:
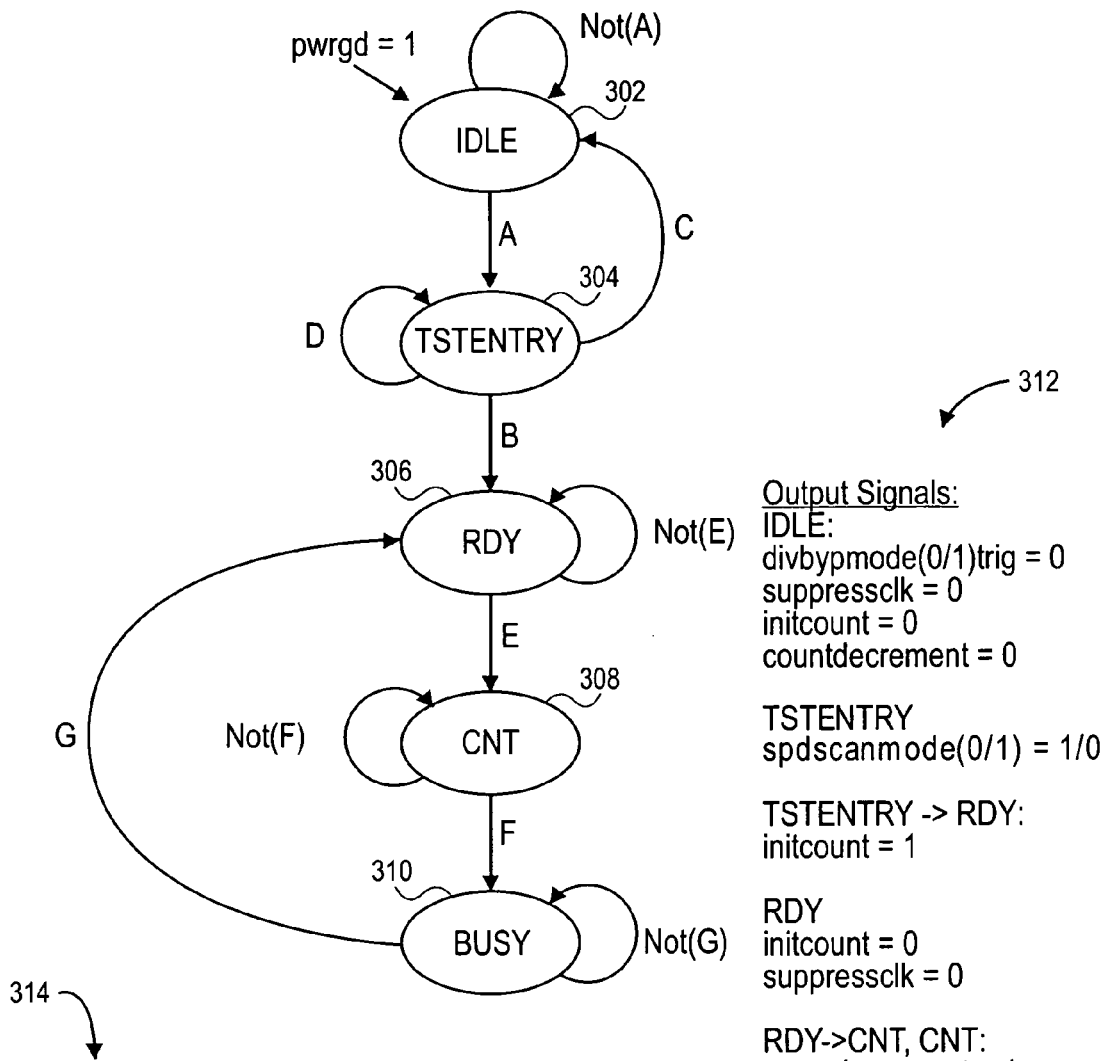
FIG. 3 is a block diagram illustrating one embodiment of a finite state machine in accordance with the teachings of the present invention.

Referring to FIG. 3, an embodiment of a master control FSM 300 is shown. Master control FSM 300 includes an idle (IDLE) state 302, a test entry (TSTENTRY) state 304, a ready (RDY) state 306, a count (CNT) state 308, and a busy (BUSY) state 310. In one embodiment, master control FSM 300 may control the overall at-speed scan testing by generating control signals for the DSCs and PLLs. In one embodiment, the state transitions occur on the negative edge of a slowscanclk signal (discussed further below). Arc equations 314 summarize the transitions between states. Output signals 312 shows the output signals at the various states.

IDLE state 302 is the default state of master control FSM 300 after assertion of a power good (pwrgd) signal. If the test entry sequence is skipped, the master control FSM 300 continues to remain in IDLE state 302 (see Arc Not(A)). All control signals of master control FSM 300 are held to the inactive state during IDLE.

An initialization test (itest) signal transitions FSM 300 to TSTENTRY 304 (see Arc A). During TSTENTRY 304, master control FSM 300 monitors the initialization test done (itestdone) signal (see Arc D). When itestdone is asserted, the transitioning to the test mode of processor 100 is completed. The next clock signal initializes the DSCs using an initialize counters (initcount) signal.

In one embodiment, the counter modules of the DSCs are initialized to the length of the longest scan chain in processor 100. The master control FSM 300 uses this counter value to generate a distributed scan capture event at each DSC independent of the external ATPG pattern, thereby eliminating the propagation delay issues of the external shiften signal.

If itestdone is asserted, but a mode has not been selected, then master control state machine returns to IDLE (see Arc C).

A state change to the RDY 306 may occur when itestdone is signaled and the presence of active values at the speed scan mode 0 (spdscanmode0) or the speed scan mode 1 (spdscanmode1) signals (see Arc B). These signals will be discussed further below, but generally, spdscanmode0 and spdscanmode1 indicate which time domain is to be tested.

At RDY 306, master control FSM 300 monitors the assertion of the external shiften pin 120 (see Arcs E and not(E)). If shiften is asserted, then the counter decrement (countdecrement) signal is asserted with a state transition to the CNT state 308.

In CNT 308, all DSCs decrement until the counter modules reach 1 (see Arc not(F)). Once the counter out (counterout) signal of each DSC reaches 1, all DSCs enable clock multiplexing in the next clock pulse (by asserting divbypmodetrig discussed below) simultaneously with a state transition to BUSY 310 (see Arc F). In one embodiment, one pre-selected DSC feeds its counterout to the master control FSM 300. The counter modules values decrement to 0 on the next clock edge.

In BUSY 310, the counter module value is held steady at 0. The DSCs generate window triggers for de-asserting shiften and clock tree multiplexing to the at-speed clock. These windows are synchronized in the at-speed scan clock domain using synchronization FFs in each SS (discussed below). Window generating signals at all DSCs should cross clock domains on the same at-speed clock (atspdscanclk) edge. In one embodiment, this may be fine tuned by adjusting the skew between the slow scan clock (slowscanclk) and the at-speed clock (atspdscanclk).

On the de-assertion of the shiften external pin 120 (see Arc G), master control FSM 300 transitions from BUSY 310 back to RDY 306. Once back at RDY 306, master control FSM 300 will hold at RDY 306 until shiften is again activated to shift in another ATPG vector. The consumer FFs are insulated from this transition from BUSY 310 to RDY 306 and do not interpret the de-assertion of shiften since the clock multiplexing window has elapsed and the suppressclk signal masks the slowscanclk during BUSY 310 state.

If the de-assertion of the external shiften pin does not occur, such as for the last ATPG vector, then the master control FSM 300 stays in the BUSY state 310. Thus, a new ATPG vector needs to start the initialization process again from the IDLE 302 state.

Turning to FIGS. 4 and 5, an embodiment of a PLL 400 is shown. In one embodiment, each time domain may have its own PLL. Oscillator (VCO) is aligned with reference clock (reflck+) 530 and forwards a clocking signal to dividers 528. Clocking signals clk 1x, 2x, 4x are described as clkout 524 and are sent to the clock trees for the scan chains. In the embodiment of FIG. 5, the clock frequencies on clk 1x, clk 2x, and clk 4x are actually all receiving the same clocking frequency of clk4x as output by dividers 528. As described below, the slow speed clock is received from burninclk 502, and the at-speed clock is received from dividers 528.

In one embodiment, the scan chains are connected to a single clock tree having the same clocking speed. Atspdscanclk 512 and slowscanclk 514 are outputs for tapping uninterrupted clock signals from PLL 400.

Burninclock 502 is coupled to an external clock for generating the slow speed clock signal. Even when the slow speed clock signal is multiplexed out during the at-speed window, burninclock 502 may continue to receive the external slow speed clock and this slow speed clock may always be available. The at-speed clock is also continuously available from dividers 528. This ensures the simultaneous availability of the slow speed clock and the at-speed clock for clock multiplexing. In an embodiment with multiple clock trees within a clock domain, clock trees for the at-speed clock and the slow speed clock need to delay match. In one embodiment, all shift paths are rated at the highest multiple of the clock frequency within the PLL clock domain.

Burninmode 538 is always active for all modes. Burninclk 502 is multiplexed to slowscanclk 514 by multiplexer (mux) 534. As discussed below, while burninclk 502 continually inputs the slow speed clock pulses, whether these slow speed clock pulses reach the consumer FFs from clkout 524 is controlled by suppressclk 510 through mux 532 and by divbypmode 516 through muxes 518, 520, and 522.

Mux 504 and mux 506 unify the shift and capture clock pulses of all consumer FFs within a PLL clock domain. Mux 504 and 506 are controlled by speed scan mode (spdscanmode) 508. Spdscanmode 508 is always active during the selected mode, and inactive for non-selected modes. If the spdscanmode is selected then the at-speed time domain of the selected PLL will be forwarded to the scan chains. In FIG. 5, the at-speed clock pulse output of dividers 528 is selected by muxes 504 and 506 when spdscanmode 508 is active.

Suppress clock (suppressclk) 510 gates the passage of duplicate last-shift and capture pulses that exist in the ATPG patterns generated with legacy ATPG tools. Activation of suppressclk 510 prevents slow speed pulses from reaching the consumer FFs by control of mux 532 (discussed further below).

Dividers-bypass-mode (divbypmode) 516 is held active for the passage of the slow speed clock to the clock trees while the ATPG vector is shifted into the scan chains. During the "window" period, divbypmode 516 transitions to inactive and suppressclk 510 is active. Muxs 518, 520, and 522 select the outputs of muxes 504 and 506. The output of muxes 504 and 506 has selected the at-speed clock pulses from dividers 528 since spdscanmode 508 is active.

Since suppressclk 510 is active, the output of mux 532 is ground. Thus, two at-speed clock pulses are allowed to pass out of clkout 524 using the control of muxes 518, 520, and 522 by divbypmode 516.

When the "window" closes, divbypmode 516 reverts to active such that muxes 518, 520, and 522 select the clock signals from mux 532. However, during the BUSY state, since suppressclk 510 is active, the slow scan clock is not outputted from mux 532. Thus, the scan chains do not receive any more clocking signals during the remainder of the BUSY state. Control of divbypmode 516 during this "window" period is by master control FSM 300.

In one embodiment, the majority of consumer FFs operate on the clk4x output. Consumer FFs tested by clk1x and clk2x need to be on separate scan chains. In one embodiment, these separate scan chains will be masked out from the clk4x associated scan chains.

It will be noted that vcobypmode 536 and mux 540 are not applicable to embodiments of the invention, but are included to show completeness of PLL 400.

In one embodiment, the signals of PLL 400 may have values as show below in Table 1.

TABLE 1

| SIGNAL | STATE |
| --- | --- |
| Suppressclk | dynamic |
| Burninmode | 1 |
| Vcobypmode | 0 |
| Spdscanmode | 1 |
| Divbypmode | dynamic for time domain under test |
|  | 1 for time domains not under test |
| Refclk+ | 100 MHz |
| Burninclk | 20 MHz |
| Clk1x, Clk2x, Clk4x | 400 MHz (capture + last shift) |
| (clk4x is the main core clock) | 20 MHz (shift) |

Figure 6A:
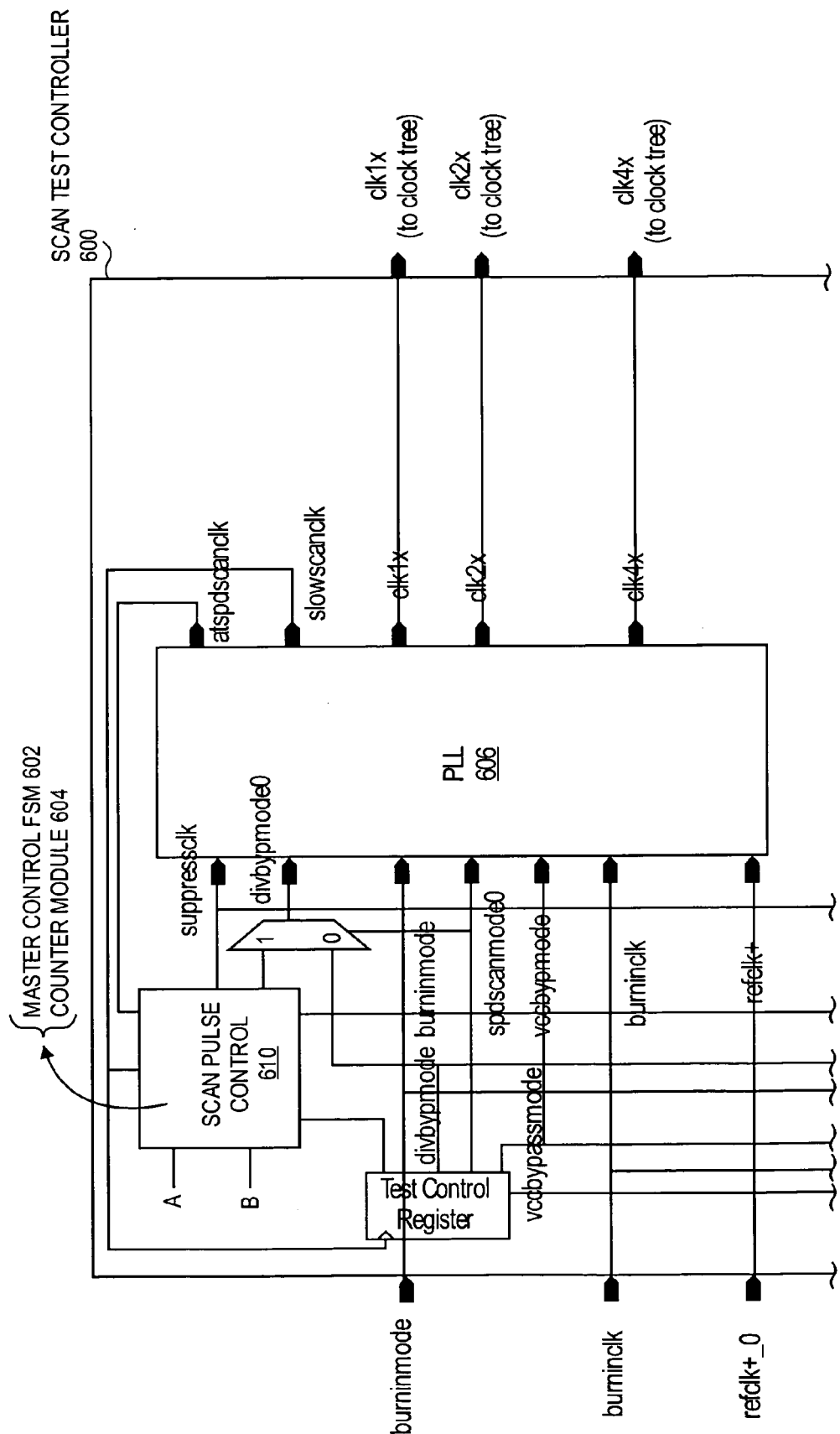
FIG. 6A is a block diagram illustrating one embodiment of a phase-locked loop in accordance with the teachings of the present invention.
Figure 6B:
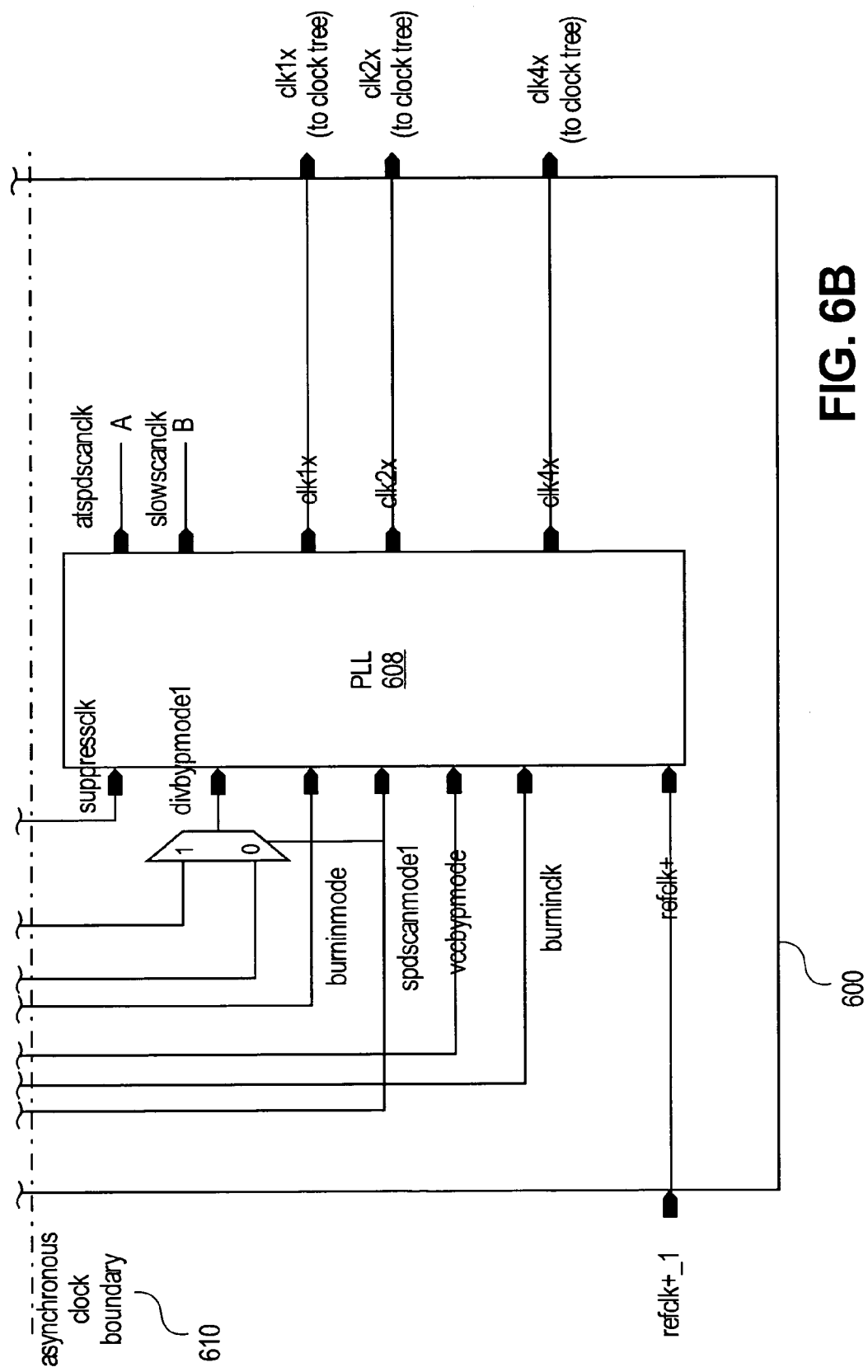
FIG. 6B is a block diagram illustrating one embodiment of a phase-locked loop in accordance with the teachings of the present invention.

Referring to FIGS. 6A and 6B, an embodiment of a scan test controller 600 to control multiple time domains is shown. Scan test controller 600 includes a PLL 606 for use with mode 0, and a PLL 608 for use with mode 1. The asynchronous clock boundary is shown at 610.

Scan test controller 600 also includes a scan pulse control 610. Scan pulse control 610 includes a master control FSM 602 and a counter module 604. CM 604 is substantially similar to the CMs at the distributed slave counters and is used for handshaking between the scan test controller 600 and the DSCs under control of scan test controller 600.

PLLs 606 and 608 produce clock signals during all modes. However, only one time domain performs a capture, as controlled by spdscanmode0 and spdscanmode1. As discussed above, the ATPG vectors may be clock restricted. PLL time domains not under test by the current ATPG patterns may have scan chain inputs constrained to either 0 or 1 in a given pattern to preserve simulation behavior. This is needed since the clock trees in the time domains not selected by spdscanmode are insulated from the last shift pulse by the assertion of suppressclk.

Figure 7:
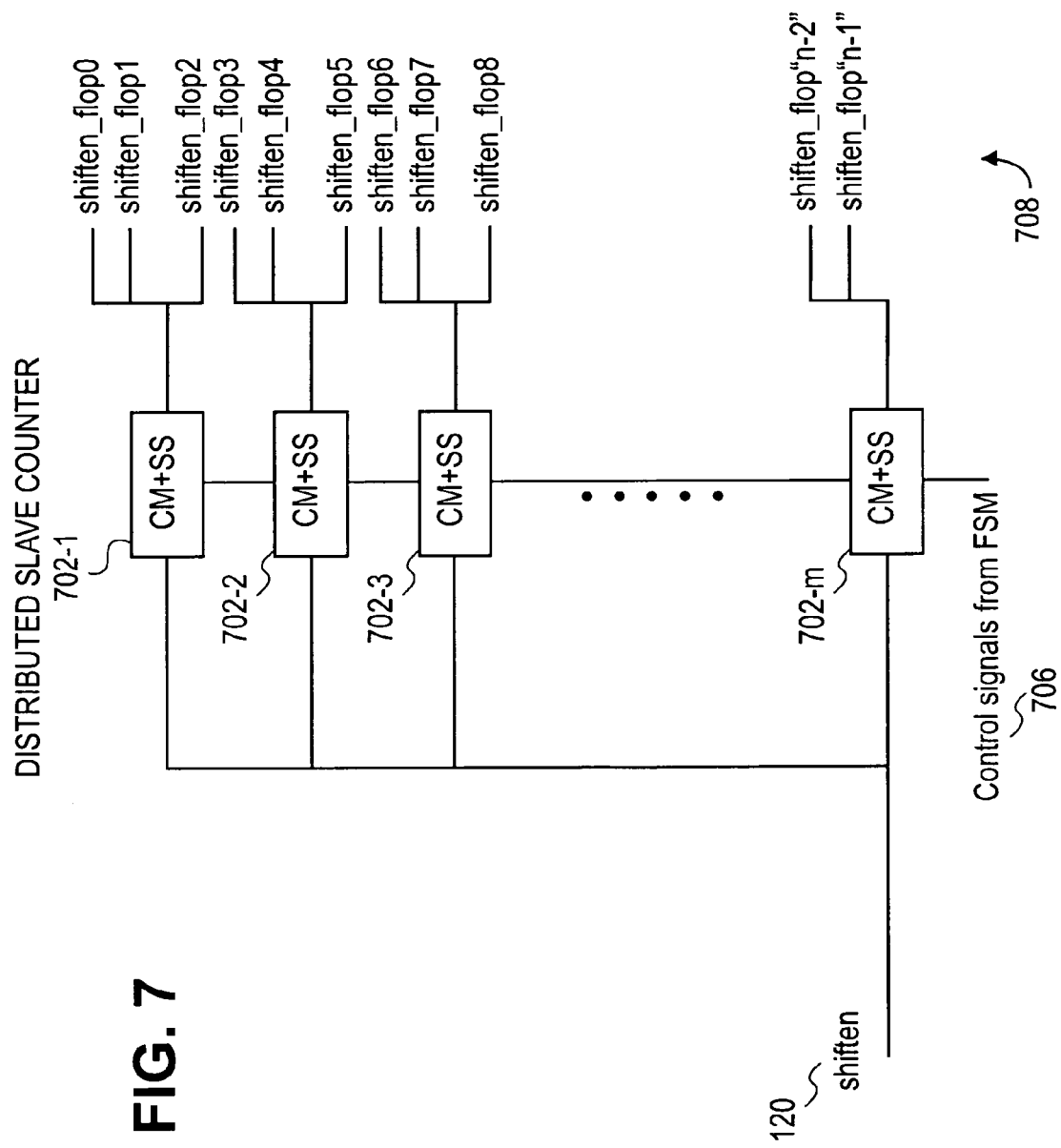
FIG. 7 is a block diagram illustrating one embodiment of distributed slave counters in accordance with the teachings of the present invention.

Turning now to FIG. 7, an embodiment of distributed slave counters 702-1 to 702-m is shown, where 'm' is the number of DSCs. Each DSC 702-1 to 702-m includes a CM and a SS. Each DSC receives the shiften signal 120 as well as control signals 706 from the master control FSM 300.

DSCs 702-1 to 702-m output shiften_flop signals 0 to "n-1" to be received by 'n' scan chains, that is, one shiften_ flop per scan chain. In one embodiment, the scan chains include a dummy FF at the beginning of each scan chain (discussed further below in conjunction with FIG. 12). In general, during the RDY and CNT states of master control FSM 300, shiften_flop signals 0 to "n-1" are based on shiften, but during the BUSY state, shiften_flop signals 0 to "n-1" are based on logic local to each DSC in order to capture the at-speed test of the combinatorial circuits.

Figure 9:
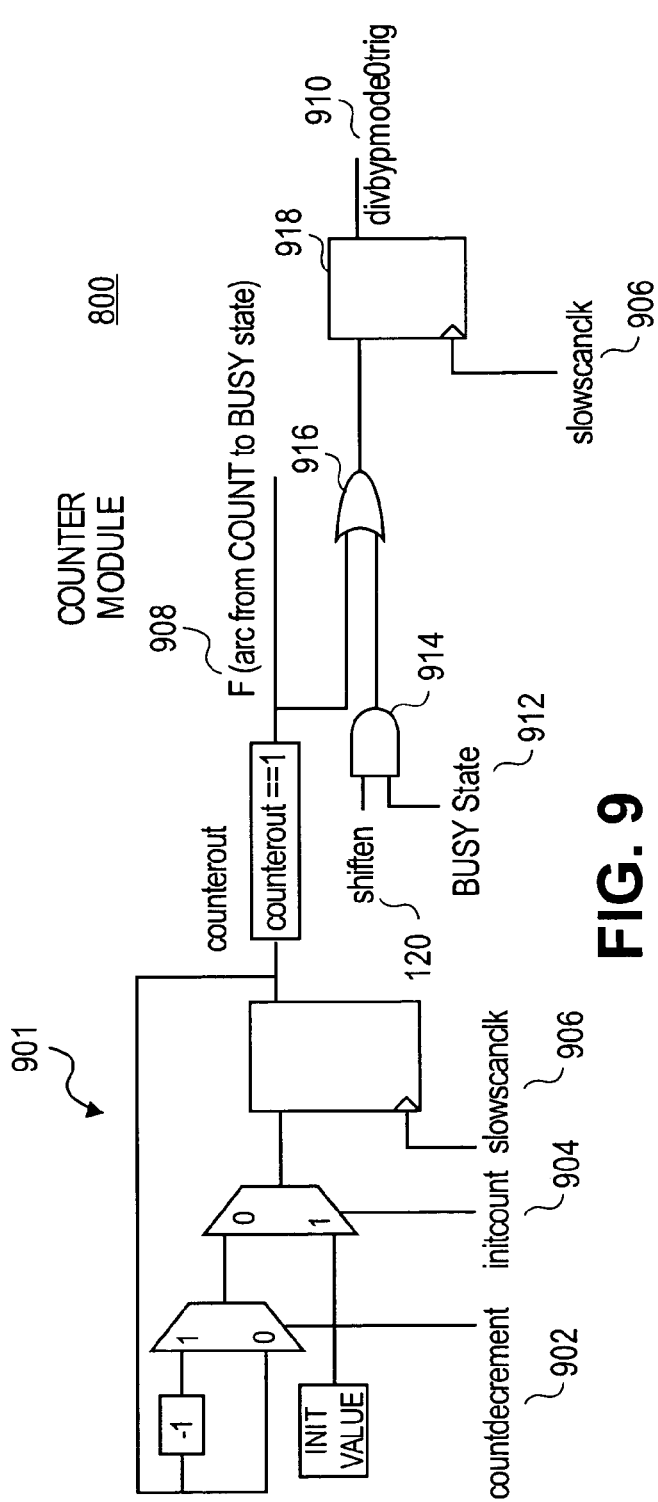
FIG. 9 is a block diagram illustrating one embodiment of a counter module in accordance with the teachings of the present invention.
Figure 8:
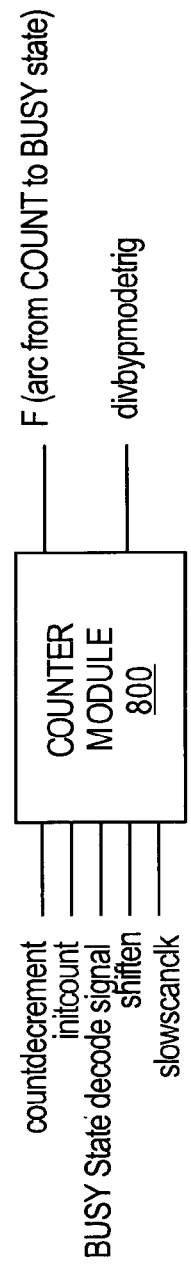
FIG. 8 is a block diagram illustrating one embodiment of a counter module in accordance with the teachings of the present invention.

Referring to FIGS. 8 and 9, an embodiment of a counter module 800 is shown. Countdecrement 902 and initcount 904 are inputted by the master control FSM 300. Slowscanclk 906 is inputted from the PLL. Signals 902, 904, and 906 are inputted into counter logic 901.

When counter logic 901 of CM 800 reaches 1, a signal is sent to the master control FSM 300, as shown at 908. In one embodiment, only one CM from all the DSCs needs to send signal 908 to the master control FSM 300 because all DSC's are decrementing from the same initial value and are all under the control of FSM 300.

Also, when counterout is one and shiften is active, the dividers-bypass-mode-trigger divbypmodetrig signal goes active on the next down edge of slowscanclk 906. As described below, divbypmode0trig 910 begins the generation of the window for the at-speed scan pulses.

BUSY state signal 912 indicates when master control FSM 300 is in a BUSY state. BUSY state signal 912 is used to provide a distributed BUSY state signal at each DSC. This distributed BUSY state signal is outputted from CM 800 as divbypmode0trig 910. In this way, the indication of the BUSY state may be generated close to the scan chains instead of being sent from the scan test controller.

AND-gate 914 ensures that the BUSY state signal 912 is only passed to FF 918 when shiften 120 is active. The output of AND-gate 914 is passed through OR-gate 916 with counterout=1. The output of OR-gate 916 is held at FF 918. The state of FF 918 is forwarded as divbypmode0trig 910 at the negative edge of slowscanclk 906. The logic described above ensures each DSC outputs a divbypmode0trig 910 at the same slowscanclk 906 negative edge for synchronization between all DSCs.

Figure 10:
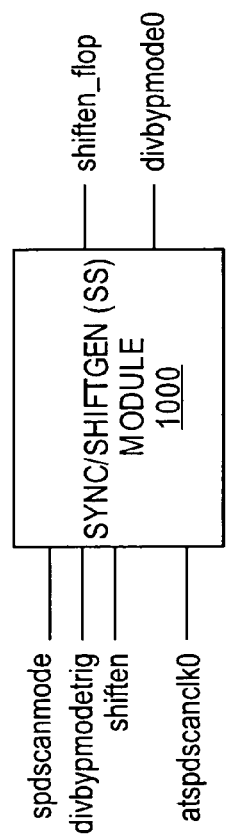
FIG. 10 is a block diagram illustrating one embodiment of a synchronization/shift generator module in accordance with the teachings of the present invention.
Figure 11:
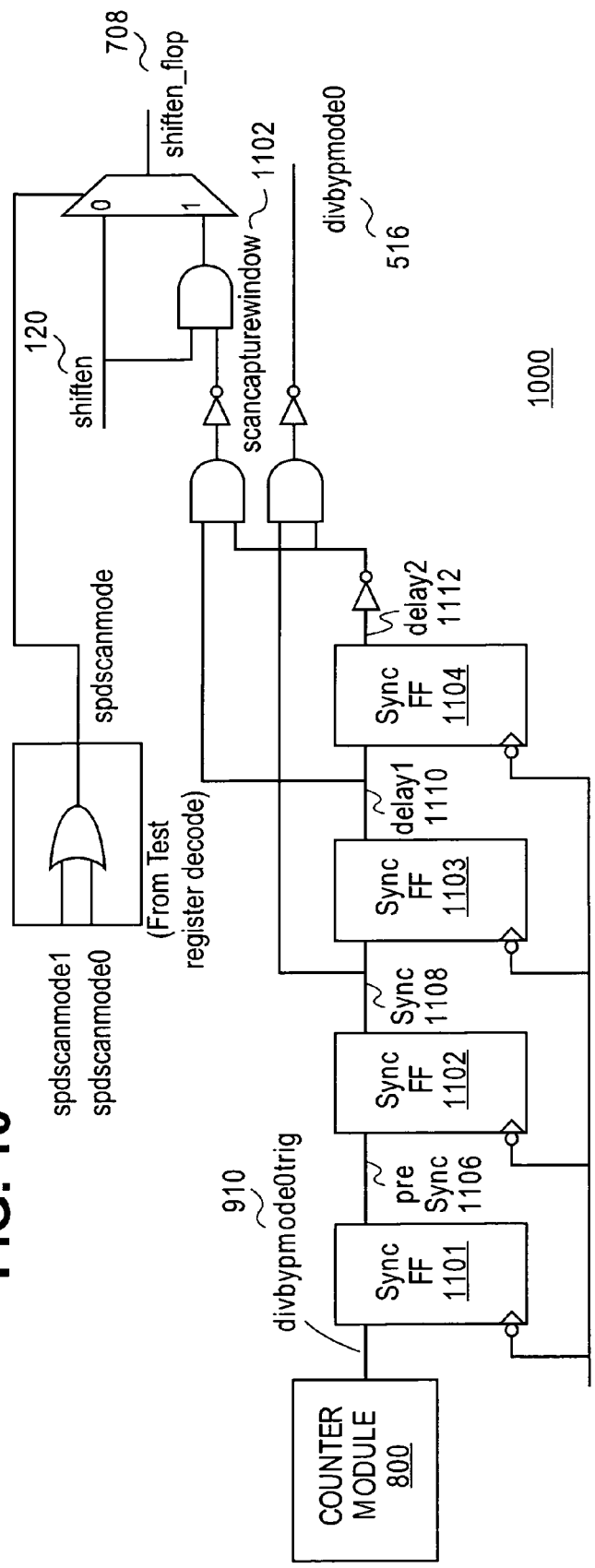
FIG. 11 is a block diagram illustrating one embodiment of a counter module and a synchronization/shift generator module in accordance with the teachings of the present invention.

Referring to FIGS. 10 and 11, an embodiment of a synchronization/shift generator (SS) module 1000 is shown. In FIG. 11, SS 1000 receives the (divbypmode0trig) signal from CM 800.

In the embodiment of FIG. 11, shiften_flop 708 is an AND function of the externally inputted shiften signal and an internally generated local signal called scan capture window (scancapturewindow) 1102. Scancapturewindow 1102 is triggered by divbypmode0trig 910 from CM 800. CM 800 is under control of master control FSM 300.

The scancapturewindow signals at the DSCs are synchronized with atspdscanclk using synchronization FFs 1101-1104. The scancapturewindow signals are normally inactive. The divbypmodetrig signal that is generated separately by each CM needs to be clock crossed into the atspdscanclk domain on the same clock edge for proper coordination between all DSCs. Synchronization FFs 1101-1104 and their associated signals will be discussed below in conjunction with FIG. 14.

The scancapturewindow signals are active only during the second atspdscanclk pulse of the active mode to ensure an at-speed last shift is followed by an at-speed capture. This technique allows the shift start event of the scan chains to be controlled by the external shiften 120 while the capture-start and the capture-end events are controlled locally at the DSCs by internal signals. These internal signals include scancapturewindow, divbypmode, atspdscanclk. FIG. 11 will be discussed further in connection with the timing diagrams of FIGS. 13 and 14.

Figure 12:
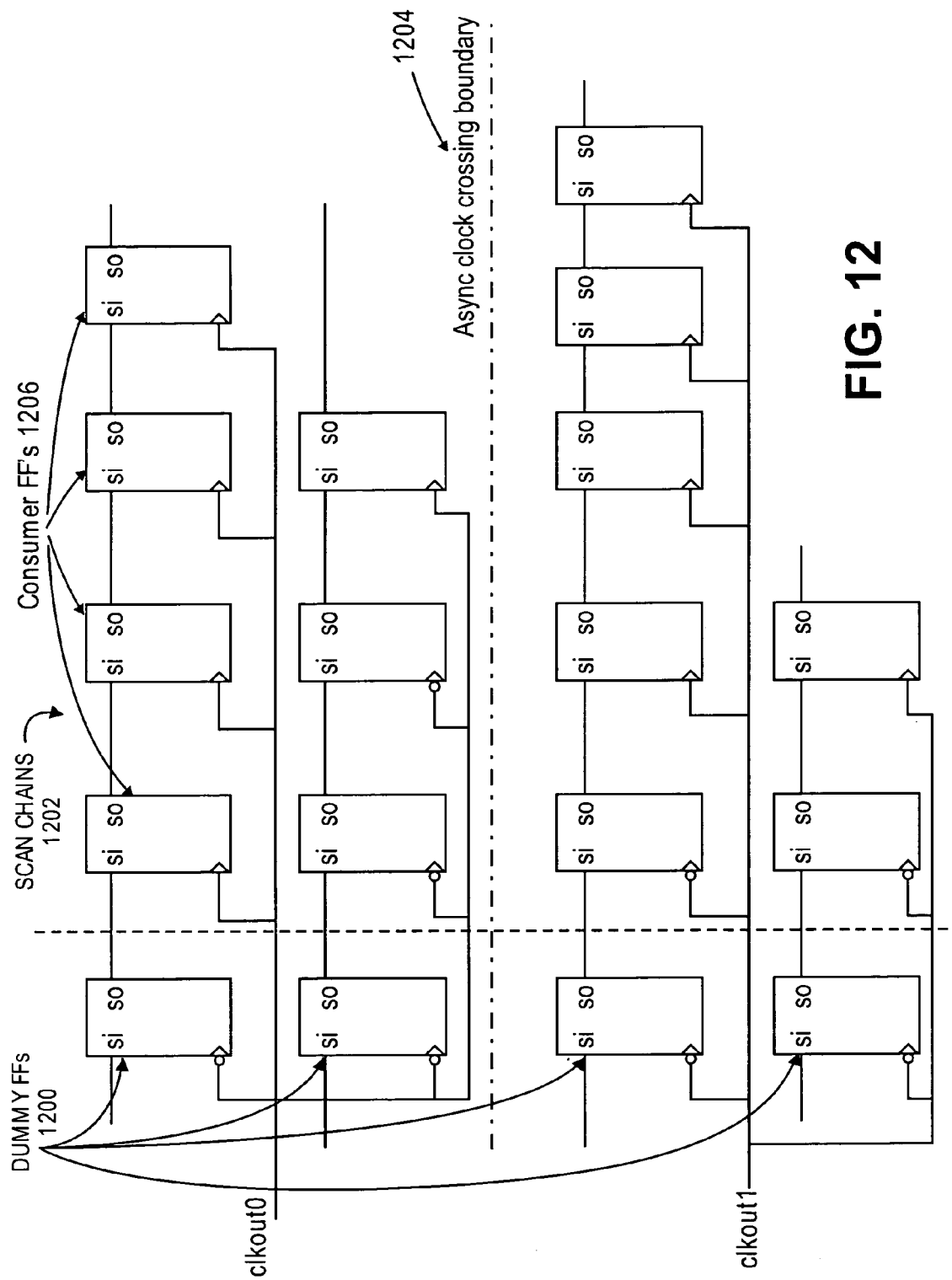
FIG. 12 is a block diagram illustrating one embodiment of dummy flip-flops in accordance with the teachings of the present invention.

Turning to FIG. 12, an embodiment of dummy FFs 1200 is shown. The dummy FFs 1200 are at the beginning of the scan chains 1202. In short, dummy FFs 1200 allow embodiments of a combinatorial at-speed scan tester as described herein to be compatible with legacy ATPG tools.

In one embodiment, the consumer FFs 1206 have a test mode and a functional mode. During the test mode, consumer FFs 1206 are coupled together in scan chains 1202 by the signal-in (si) and signal-out (so) terminals. The consumer FFs 1206 each also have a data input (not shown) for use in the functional mode. The shiften_flop signal received at each scan chain selects the consumer FFs 1206 between the test mode (shiften_flop active and data is loaded from si) and functional mode (shiften_flop inactive and data loaded at data input). In embodiments herein, the consumer FFs 1206 are used in a dual mode for launching the test pattern into the combinatorial circuit and capturing the results. In another embodiment, the consumer FFs 1206 are also tested.

Since the last shift pulse is automatically generated internally by each DSC during the second-to-last shift time interval of the external ATPG reference, this last shift pulse may shift incorrect data into the scan chains. To prevent this behavior, an additional negative clock edge triggered FF needs to be added at the beginning of each scan chain. Dummy FFs 1200 serve as these additional FFs. Dummy FFs 1200 are masked as to comparison and their output may not influence any internal logic of the combinatorial circuit under test. FIG. 12 shows two time domains (clkout0 for mode 0 and clkout1 for mode 1) separated by an asynchronous clock crossing boundary 1204. In one embodiment, slow speed clocking signals and at-speed clocking signals are received at clkout0 when mode 0 is selected.

Figure 13:
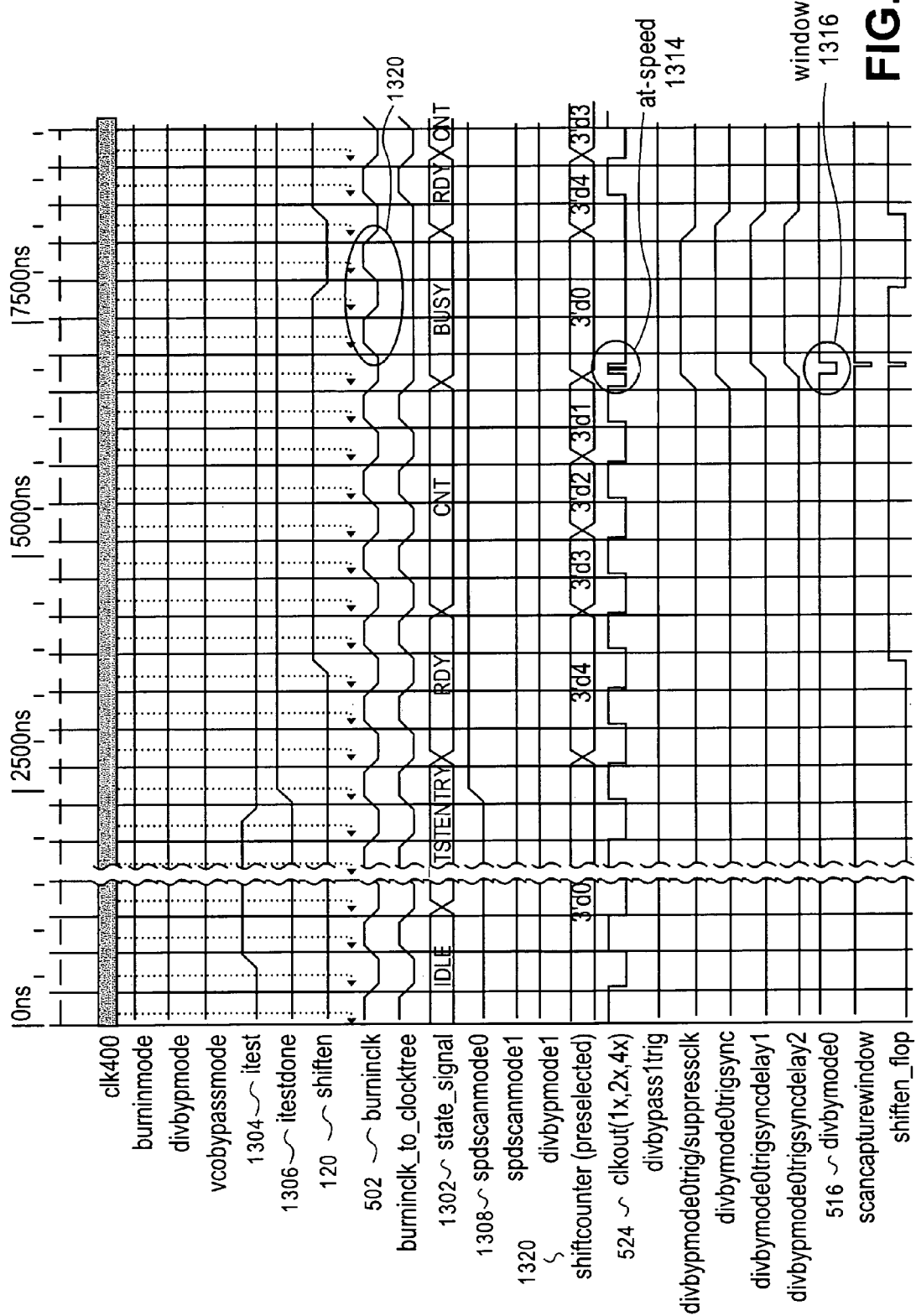
FIG. 13 is a timing diagram illustrating one embodiment of combinatorial at-speed testing in accordance with the teachings of the present invention.
Figure 14:
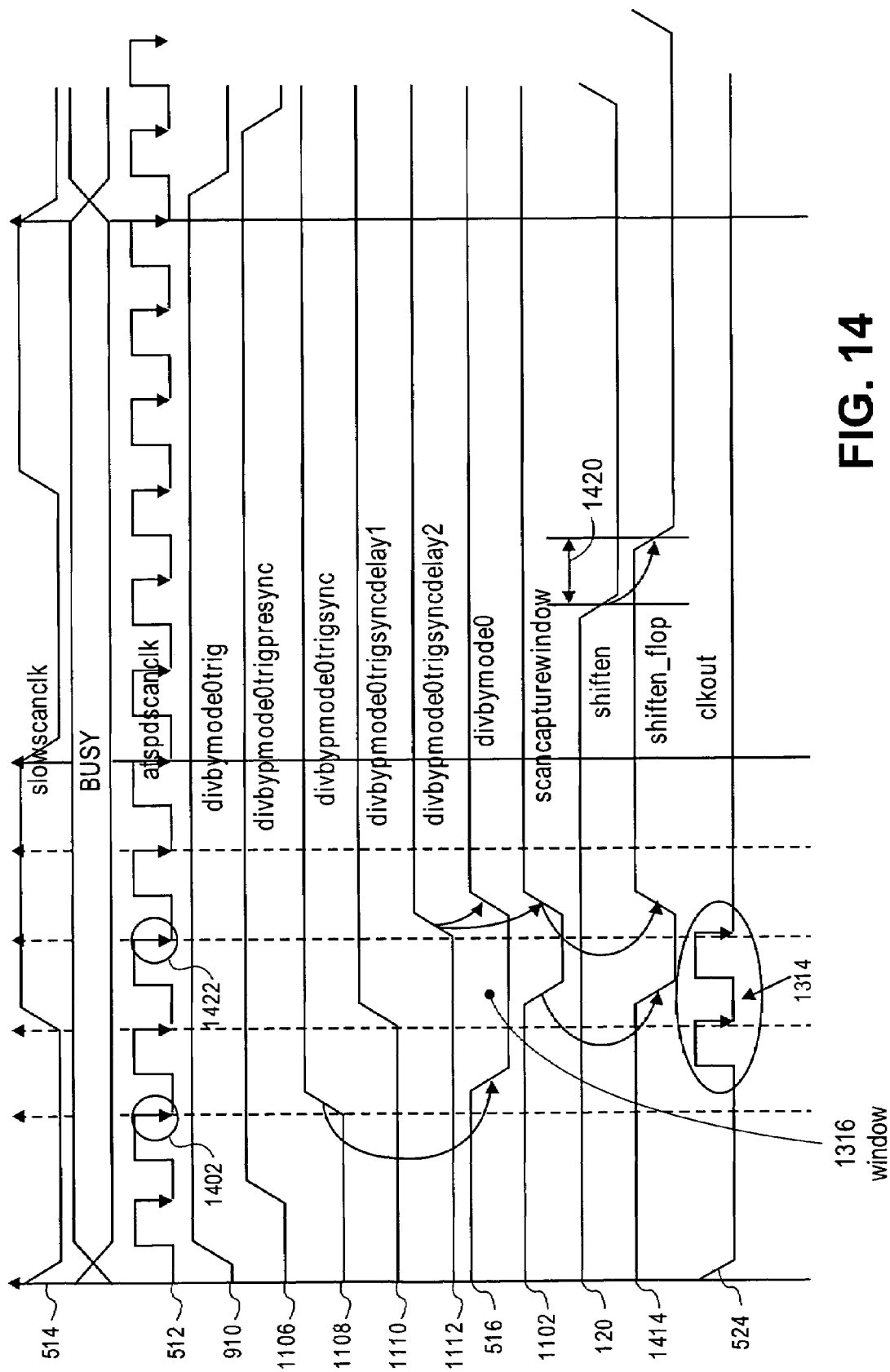
FIG. 14 is a timing diagram illustrating one embodiment of combinatorial at-speed testing in accordance with the teachings of the present invention.

Referring to FIGS. 13 and 14, timing diagrams of an embodiment of the present invention are shown. FIG. 13 shows an embodiment of combinatorial at-speed scan testing through the various states of the master control FSM 300, as shown by state signal 1302. FIG. 14 shows signal transitions during the BUSY state when the window is opened and closed for the at-speed clock pulses to pass to the consumer FFs. The embodiment of FIG. 13 uses a scan chain with four storage cells, as shown by four shifts at shift counter (shiftcounter) signal 1320.

State_signal 1302 shows that the master control FSM 300 starts at IDLE 302. State_signal 1302 transitions to TSTENTRY 304 when itest 1304 becomes active. When itestdone 1306 and scanspdmode0 1308 are activated, the master control FSM 300 transitions to RDY. In the embodiment of FIGS. 13 and 14, mode 0 is the selected time domain.

Master control FSM 300 holds at RDY until shiften 120 is activated. At this time, the master control FSM 300 transitions to the CNT state. Master control FSM 300 holds at RDY until the counter output (counterout) signal is 1. When counterout reaches 1, then master control FSM 300 transitions to BUSY.

At BUSY, countdecrement is held at 0 and suppressclk goes active. As discussed above in conjunction with FIG. 5, suppressclk 510 multiplexes out the slow speed clock. Thus, the slow-speed clock pulses shown at clkout 524 are multiplexed out and two at-speed pulses 1314 are substituted in clkout 524 from dividers 528. Divbypmode0 516 opens the window 1316 that allows the at-speed pulses 1314 to pass to the consumer FFs. Burninclk 502 continues to send two slow-speed pulses 1320 that normally result in the clkout 524. However, the slow-speed clock pulses from burninclk 1322 never reach the consumer FFs because suppressclk 510 goes active in BUSY and multiplexes out burninclk 502 (see FIG. 5).

When shiften 120 is de-asserted, the master control FSM 300 transitions back to the RDY state. During the transition from BUSY to RDY, initcount is set to 1. When at RDY, initcount is set to 0. Suppressclk is also set to 0 at RDY (refer to output signals 312 of FIG. 3).

Turning to FIG. 14, a timing diagram associated with the BUSY state of master control FSM 300 is shown. During the BUSY state, the slow-speed pulse is suppressed during the window period and the consumer FFs receive the two at-speed pulses. The following discussion of FIG. 14 will also reference FIG. 11.

Divbypmode0trig 910 is delayed by synchronization FFs 1101-1104 and atspdscanclk 512 for synchronization control and to prevent clock-crossing metatestability issues. Divbypmode0trig 910 goes active in the BUSY state and is inputted into synchronization FF 1101. Synchronization FF 1101 outputs divbypmode0trigpresync 1106 that is inputted into synchronization FF 1102. Synchronization FF 1102 outputs divbypmode0trigsync 1108. Divbypmode0trigsync 1108 is inputted into synchronization FF 1103. Synchronization FF 1103 outputs divbypmode0trigsyncdelay1 1110 that is inputted into synchronization FF 1104. Synchronization FF 1104 outputs divbypmode0trigsyncdelay2 1112. As shown in FIG. 14, divbypmode0trigpresync 1106, divbypmode0trigsync 1108, divbypmode0trigsyncdelay 1110 and divbypmode0trigsyncdelay2 1112 are triggered by the negative edge of atspdscanclk 512.

Divbypmode0 516 is a combination of divbypmode0trigsync 1108 and divbypmode0trigsyncdelay2 1112. As discussed in conjunction with FIG. 5, when divbypmode0 516 goes inactive, the at-speed clock pulses are allowed through to the consumer FFs from clkout 524. Divbypmode0 516 defines window 1316 for the two at-speed pulses 1314.

During the first pulse of at-speed pulses 1314, shiften-flop 1414 remains active. This first at-speed pulse serves as the last-shift for the scan chain. The last-shift also serves as the launch event.

Once divbypmode0trigsyncdelay1 1110 goes active, scancapturewindow 1102 opens by going inactive. Scancapturewindow 1102 going inactive causes shiften_flop 1414 to go inactive. Thus, at the second pulse of at-speed pulses 1314, the capture event occurs. When divbypmode0trigsyncdelay2 1112 goes active, this causes scancapturewindow 1102 to close by going active again and shiften_flop 1414 to go active.

Also, divbypmode0trigsyncdelay2 1112 going active causes divbypmode0 516 to return to an active state. Thus, divbypmode0 516 can multiplex in the slow speed clock to clkout 524. However, since suppressclk 510 is still high during BUSY, clkout 524 is not forwarded because of mux 532 (see FIG. 5). As seen in FIG. 14, slowscanclk 514 and atspdscanclk 512 continue to be active during the BUSY state. When the slow speed and at-speed clock signals are allowed to reach the consumer FFs is controlled by the master control FSM 300 through PLL 400.

The timing of window 1316 is guaranteed because window 1316 is generated by atspdscanclk 512 itself. Down edge 1402 of atspdscanclk 512 starts the window 1316 of divbypmode0 1318 via divbypmode0trigsync 1108. In turn, window 1316 is closed by down edge 1422 that causes divbypmode0trigsyncdelay2 1112 to go active.

The linking of the atspdscanclk 512 to the size of window 1316 leads to the scalability of embodiments of the present invention. If the speed of atspdscanclk 512 is increased, then the size of window 1316 is shrunk accordingly. Thus, the use of the two at-speed pulses in the window may be easily adjusted. In one embodiment, the speed of the atspdscanclk 512 may be adjusted to determine at what speed a particular defect occurs. Since the window size and launch-capture events are coordinated from atspdscanclk 512, the same test pattern may be repeatedly applied to the same consumer FFs using different PLL frequencies.

To ensure that all DSCs behave in the same fashion and are coordinated in timing, the relationship between slowscanclk 514 and atspdscanclk 512 is controlled at the scan test controller 104. The window 1316 in each DSC is started by the same down edge 1402 of the same atspdscanclk 512. As described above, the atspdscanclk 512 is generated by the PLL and distributed to all of the DSCs.

Delay 1420 shows the propagation delay for the external shiften 120 to reach the consumer FFs in processor 100. This natural propagation delay normally aggravates the successful timing of at-speed tests. By using shiften_flop at the DSCs that are physically close to their consumer FFs, the propagation delay is minimized.

FIGS. 15-18 illustrate other embodiments of the present invention. In one embodiment, suppressclk is divided into suppressclk0 and suppressclk1 for time domains 0 and 1, respectively. This provides additional flexibility in the scan chain inputs provided to the time domain not under the at-speed test. This removes pattern restrictions on the scan chains not under test and improves test efficiency in terms of pattern count.

Figure 15:
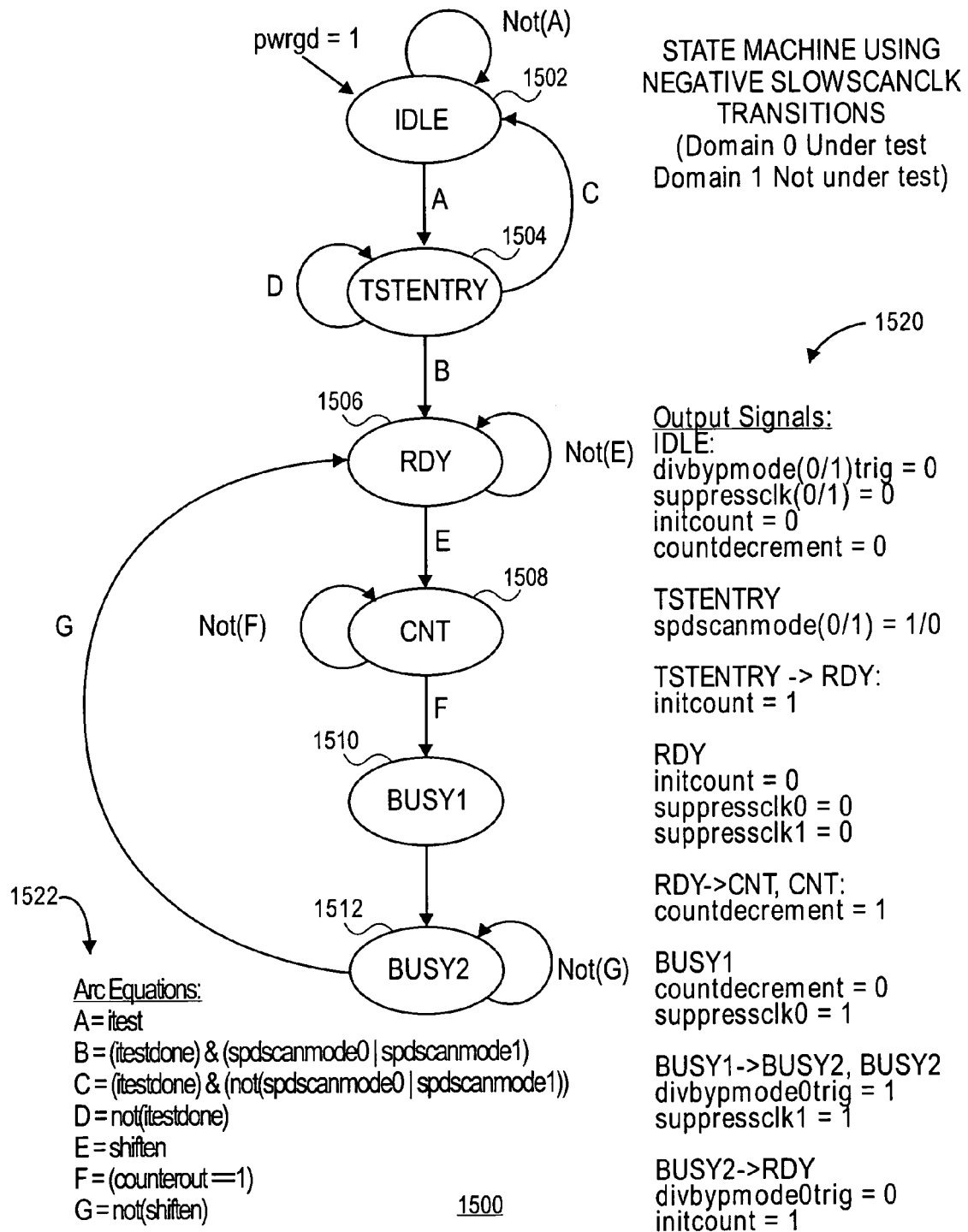
FIG. 15 is a block diagram illustrating one embodiment of a finite state machine in accordance with the teachings of the present invention.

Turning to FIG. 15, an embodiment of a Master Control FSM 1500 is shown. In the embodiment of FIG. 15, domain 0 is under test and domain 1 is not under test. As used herein, domain under test refers to the domain under the at-speed test. The domain not under test refers to the domain not under the at-speed test. However, various test patterns may be placed in the scan chains of the time domain not under test; there are no pattern restrictions in these scan chains. While embodiments below use domain 0 as the domain under test, one of ordinary skill in the art having the benefit of this disclosure would appreciate how these embodiments may be applied to testing of time domain 1. Further, embodiments of the invention are not limited to two time domains but may be used with more than two time domains.

FSM 1500 includes an IDLE state 1502, a TSTENTRY state 1504, a RDY state 1506, and a CNT state 1508. These states operate similarly as in the embodiment of FSM 300 above.

FSM 1500 also includes a BUSY1 state 1510 and a BUSY2 state 1512. FSM 1500 uses suppressclk0 and suppressclk1. As shown at 1520, suppressclk0 and suppressclk1 are both initialized to logical '0' at IDLE 1502. BUSY1 1510 and BUSY2 1512 will be discussed further below.

In one embodiment, FSM 1500 may be used with the DSC scheme as described above in conjunction with FIGS. 1-14.

Figure 16A:
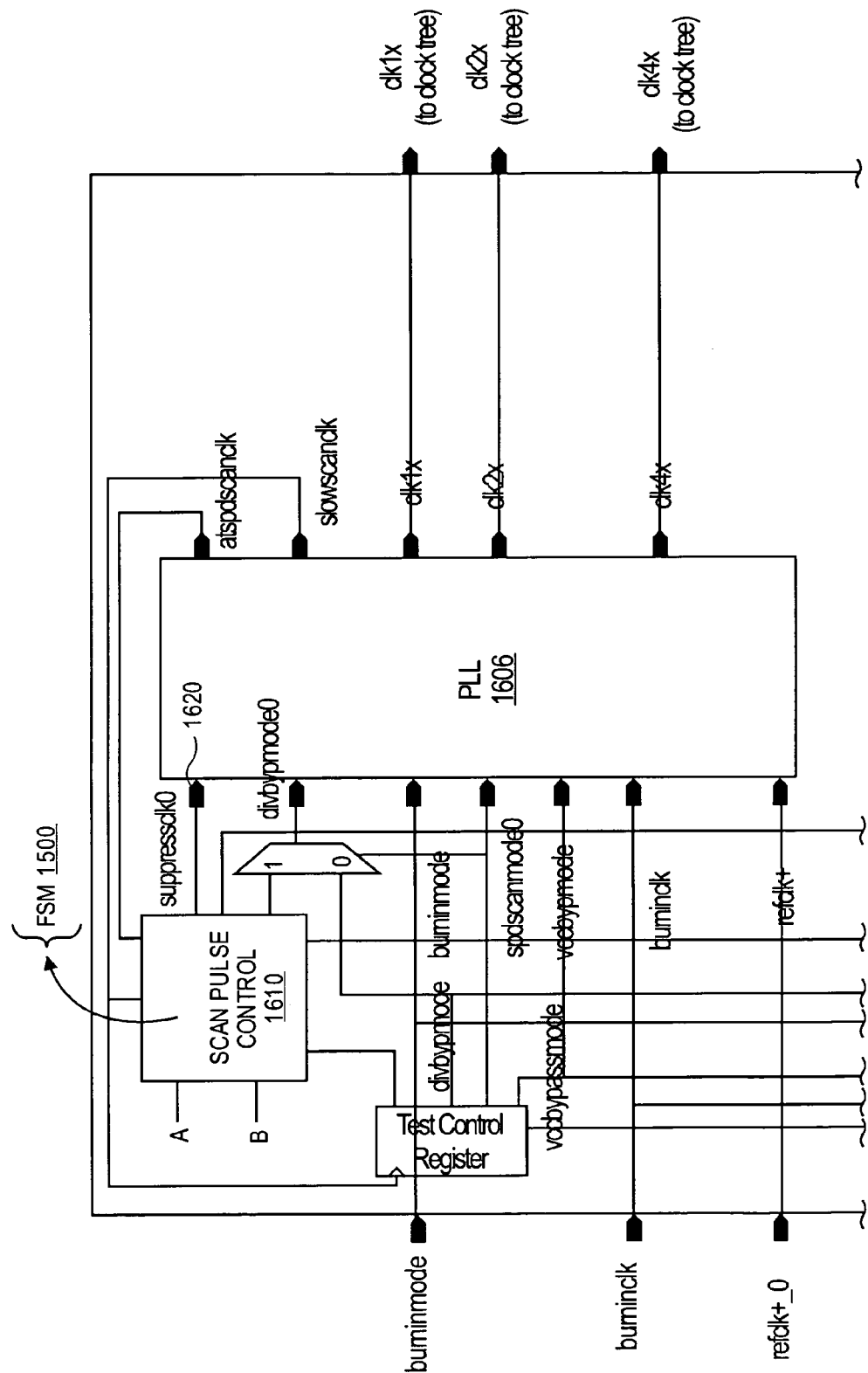
FIG. 16A is a block diagram illustrating one embodiment of a phase-locked loop in accordance with the teachings of the present invention.
Figure 16B:
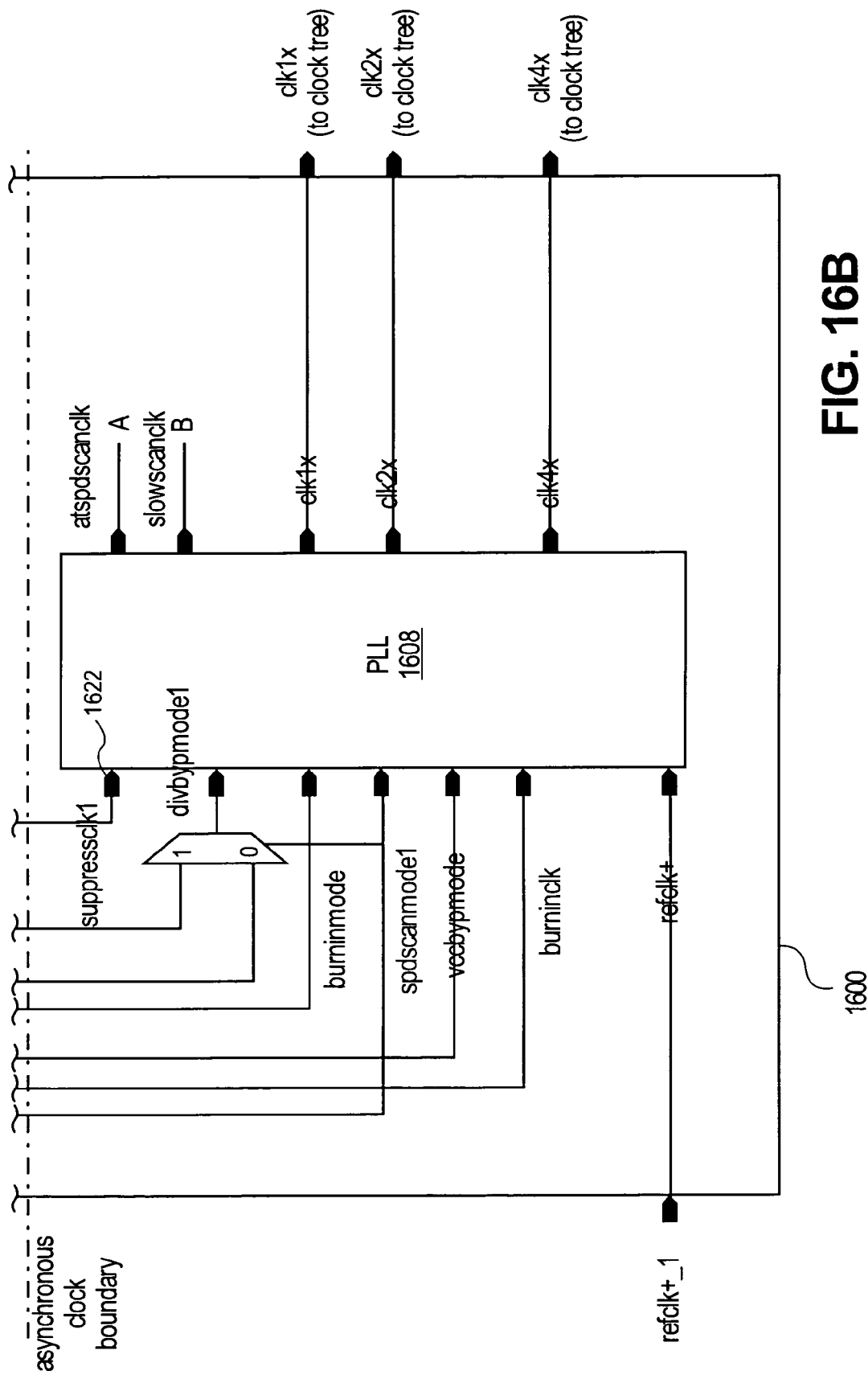
FIG. 16B is a block diagram illustrating one embodiment of a phase-locked loop in accordance with the teachings of the present invention.

Turning to FIGS. 16A and 16B, an embodiment of scan test controller 1600 is shown. Scan test controller 1600 includes a scan pulse control 1610 that includes FSM 1500. Each PLL of scan test controller 1600 receives its own suppressclk signal. PLL 1606 receives suppressclk0, shown at 1620, that is associated with time domain 0 and PLL 1608 receives suppressclk1, shown at 1622, that is associated with time domain 1. PLL 1606 provides clocking signals to one group of scan chains for testing in time domain 0, while PLL 1608 provides clocking signals to another group of scan chains for testing in time domain 1.

Returning to FIG. 15, at CNT 1508, when the counter out signal (counterout) reaches 1, FSM 1500 transitions to BUSY1. FSM 1500 stays at BUSY1 1510 for one slow speed clock pulse. Also during BUSY1, counterdecrement becomes 0.

Also at BUSY1, suppressclk0 is asserted. Thus, the clock is suppressed for only the domain under test. The remaining time domain(s) will receive the last slow clock pulse because the suppressclk signals of the domains not under test are not asserted. The clock cycle during BUSY1 for the domains not under test allows the last-shift of the test pattern into the scan chains that are part of the domain not under test.

After one slow speed clock cycle, FSM 1500 proceeds to BUSY2 1512. It will be noted that there is no condition to stay in BUSY1 for more than one clock cycle. BUSY1 is one clock cycle long so only one shift occurs in the domains not under test. In the transition to BUSY2, divbypmode0trig is asserted and suppressclk1 is asserted. During BUSY2, suppressclk0 and suppressclk1 are asserted to stop the slow speed clock from reaching the scan chains. During BUSY2, the at-speed test may occur similarly as discussed above in conjunction with the BUSY state 310 of FSM 300.

In another embodiment, scan test controller 1600 may be used with FSM 300. Suppressclk0 and suppressclk1 may work together as a single suppressclk, and not be decoupled. However, it will be appreciated that in this particular embodiment, there will be pattern restrictions on the domain(s) not under test as discussed above in conjunction with FIGS. 6A and 6B.

Figure 17:
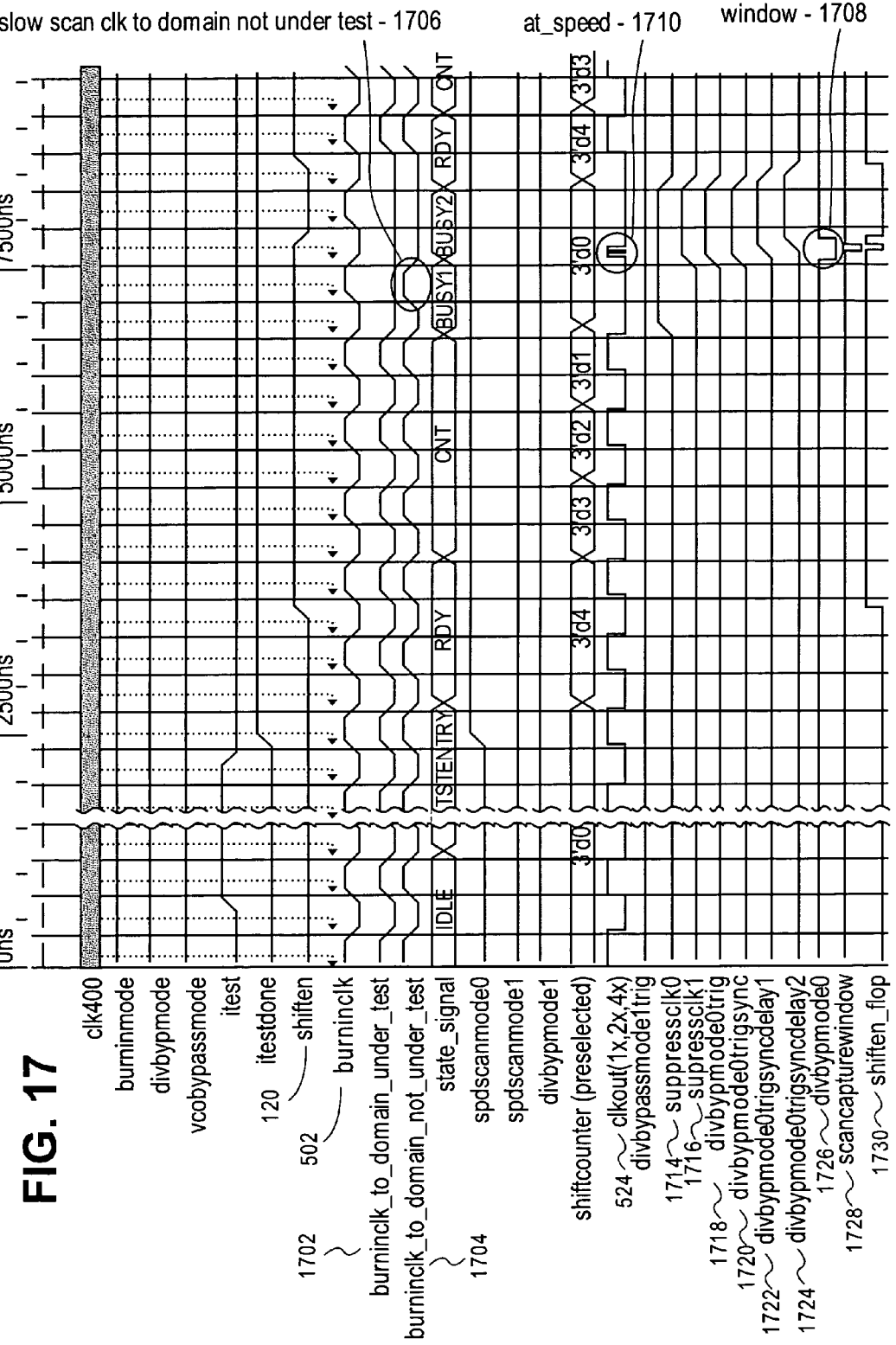
FIG. 17 is a timing diagram illustrating one embodiment of combinatorial at-speed testing in accordance with the teachings of the present invention.
Figure 18:
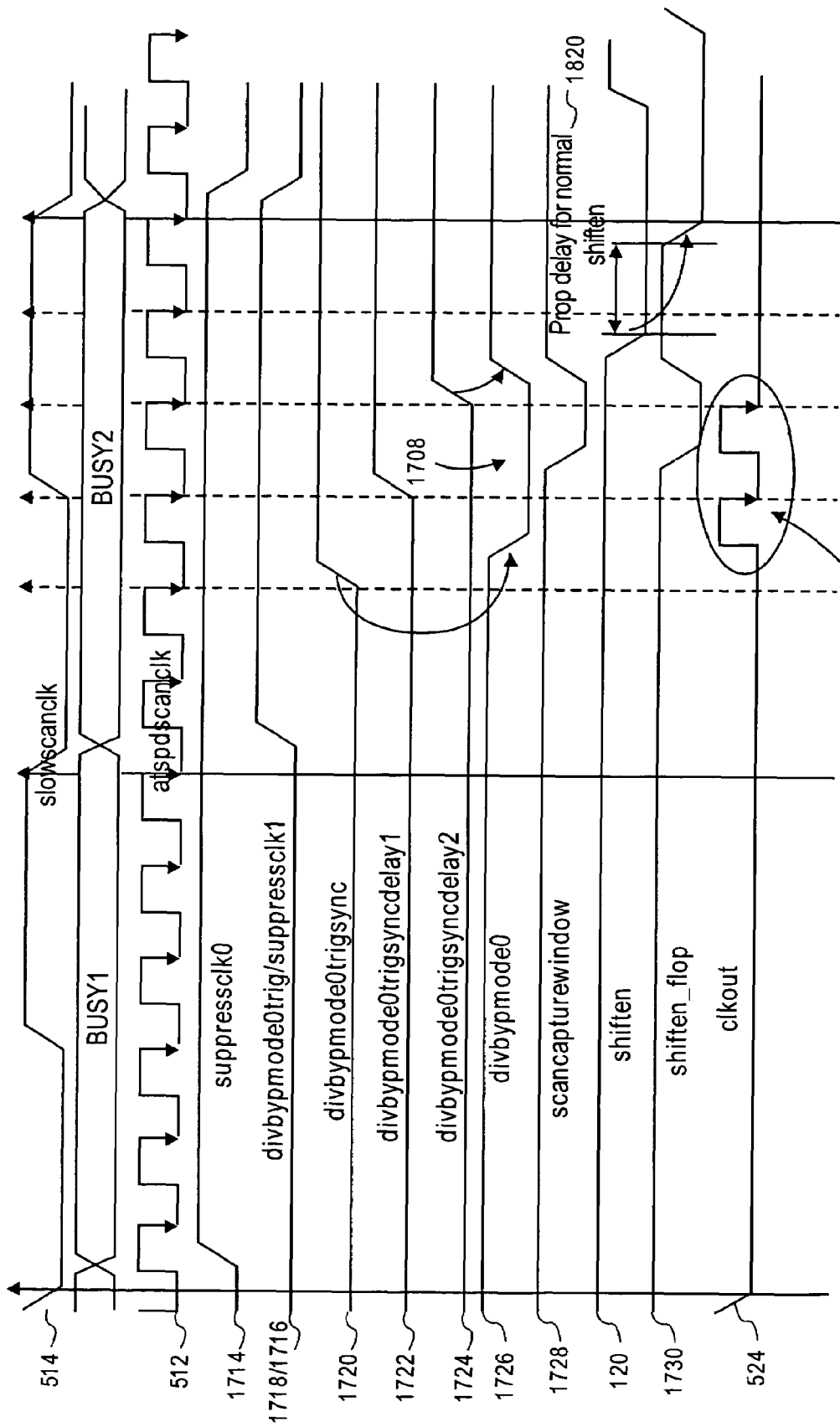
FIG. 18 is a timing diagram illustrating one embodiment of combinatorial at-speed testing in accordance with the teachings of the present invention.

Turning to FIGS. 17 and 18, an embodiment of a timing sequence in relation to FSM 1500 is shown. In FIG. 17, burninclk 502 (the slow speed clock) is inputted into the PLL. In FIG. 18, slowscanclk 514 is shown. As a reminder, slowscanclk 514 is a tap of burninclk 502 and may be referred to interchangeably herein.

Burninclk_to_domain_under_test 1702 refers to the burninclk pulses that reach the domain under test. During BUSY1 and BUSY2, Burninclk_to_domain_under_test 1702 is prevented from reaching the scan chains under test due to the muxing at the PLL (see FIG. 5). Instead, the two at-speed pulses 1710 are sent to the domain under test for the last-shift and capture events.

Burninclk_to_domain_not_under_test 1704 has a single pulse 1706 that is allowed to reach the scan chains not under test because suppressclk1 is still low at BUSY1. Thus, burninclk 502 is allowed to propagate to the scan chains not under test as clkout 524 for the last shift.

The last shift of the scan chains not under test during BUSY1 provide predictability to the testing scheme. While domain 0 and 1 may be independent as to timing, domain 0 and 1 may be logically interdependent. The combinatorial logic of the two time domains may have some dependencies on each other. Thus, after the slowscanclk pulse of BUSY1, the scan chains of the domain not under test are loaded with known test pattern values. Thus, when these scan chains are shifted out after capture, the ATPG tool can see what affects these scan chains may have had on the domain under test.

At BUSY2, suppressclk1 is asserted. Thus, the burninclk 502 is not allowed to reach the domains not under test. Also, for the domain under test, window 1708 is opened to allow two at-speed pulses 1710 to pass to the scan chains as clkout 524 for the last-shift of these scan chains associated with the domain not under test.

FIGS. 17 and 18 also show the synchronization signals for window 1708. FIGS. 17 and 18 show divbypmode0trigsync 1720, divbypmode0trigsyncdelay 11722 and divbypmode0trigsyncdelay2 1724. These synchronization signals operate similarly as discussed above in conjunction with the timing diagram in FIGS. 13-14. The shift propagation delay associated with shiften 120 is shown at 1802. Scancapturewindow 1728 is also shown wherein the capture pulse of the two at-speed pulses occurs.

It will be noted that collision should be avoided between shiften 120 and clkout 524 and between shiften 120 and shiften_flop 1730 during the BUSY2 state. The two at-speed pulses 1710 of clkout 512 occur during the same slowscanclk cycle 514 as when shiften 120 is de-asserted (see FIG. 18). Also, shiften_flop 1730 is de-asserted in the same slowscanclk cycle 514 as shiften 120. As a comparison, in the embodiment of FIG. 14, shiften 120 is de-asserted in a different slowscanclk cycle than the occurrence of the two at-speed pulses and the de-assertion of shiften_flop. A collision may cause instability. Instability may occur because consumer FFs may not "see" the first at-speed pulse (i.e., the last-shift) if shiften 120 is being de-asserted or has been de-asserted. Consumer FFs located closer to the shiften 120 external pin may be more susceptible to collision than those consumer FFs located further from the shiften 120 external pin.

In one embodiment, to avoid a collision, the burninclk 502 may be slowed down to provide plenty of time for at-speed pulses 1710 to occur and for shiften-flop 1730 to de-assert and re-assert before shiften 120 is de-asserted.

The ability to use various test patterns in the scan chains of the domain not under test during the testing of the domain under test leads to a reduction in pattern count. The test patterns sent to the domains not under test is not restricted to test patterns of all logical 0's or all logical 1's. Multiple test patterns may be combined in the domain under test as well as the domain not under test. This reduction in pattern count may lead to a reduction in total test time.

As described earlier, embodiments herein allow for legacy ATPG tools using slow speed test patterns to be used for at-speed testing. The generation of the at-speed test is made by logic on-board the processor under test and does not require "knowledge" of the at-speed test by the ATPG tool.

Figure 19:
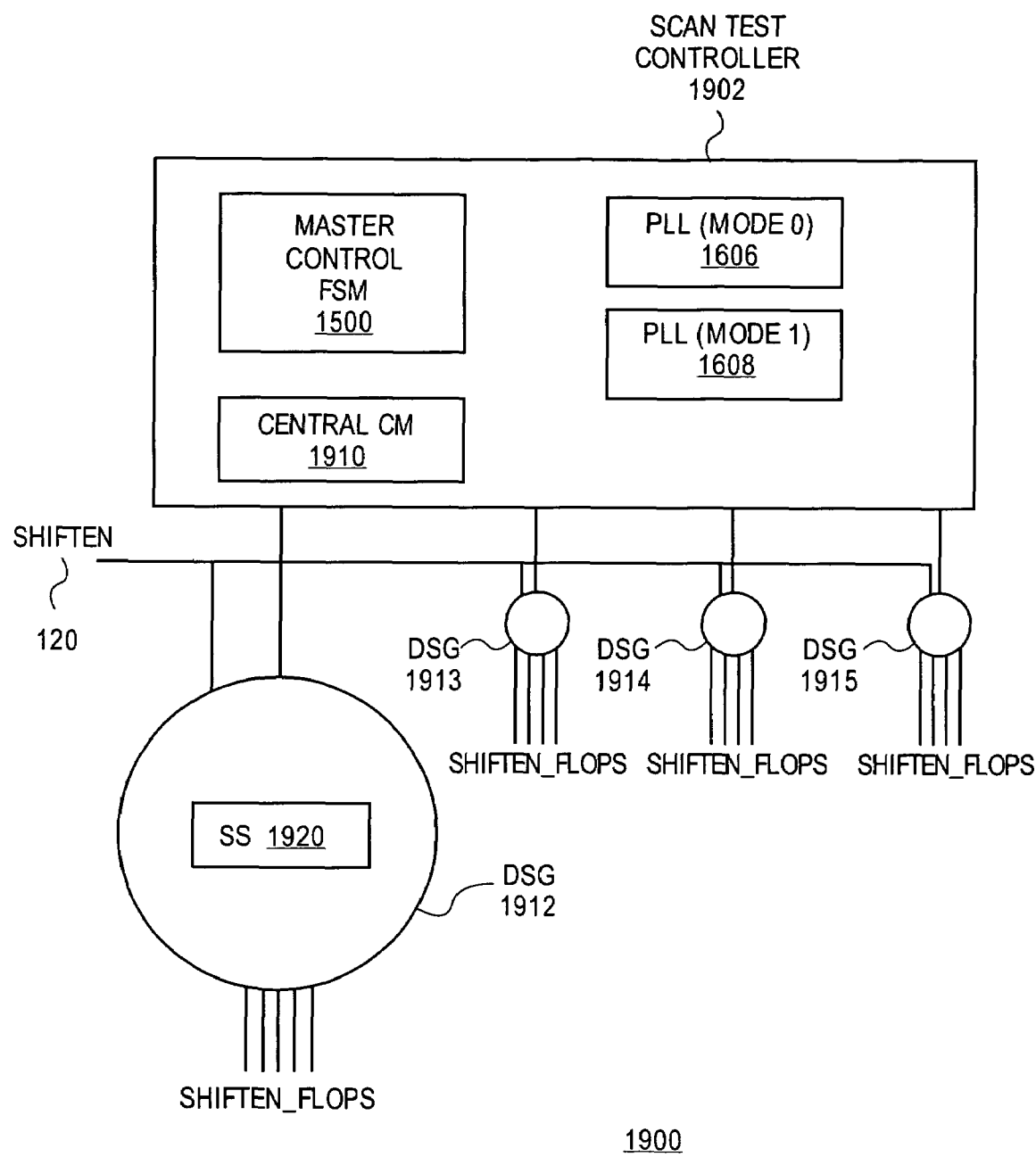
FIG. 19 is a block diagram illustrating one embodiment of a combinatorial at-speed scan tester in accordance with the teachings of the present invention.
Figure 20:
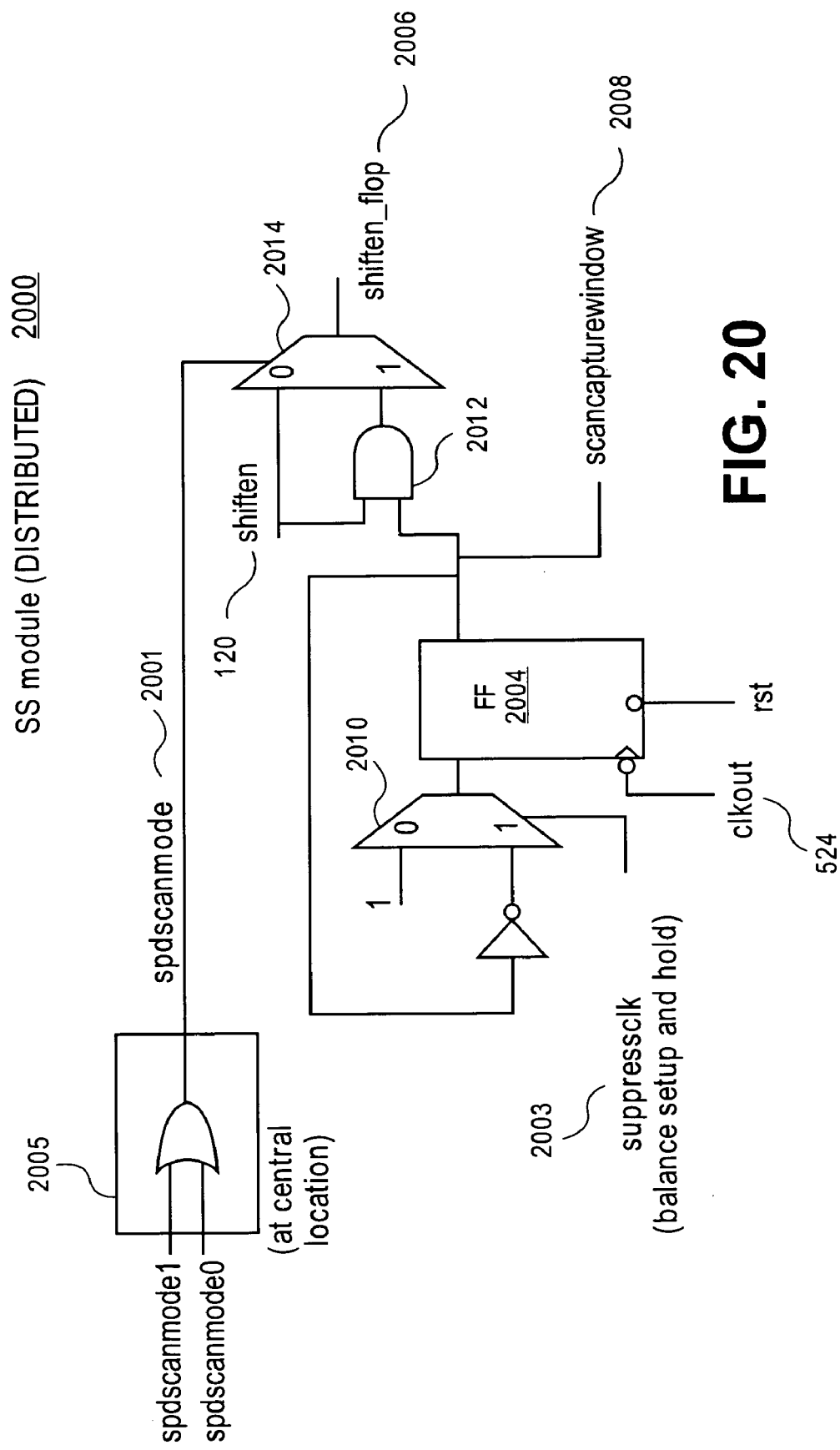
FIG. 20 is a block diagram illustrating one embodiment of a shift generator module in accordance with the teachings of the present invention.
Figure 21:
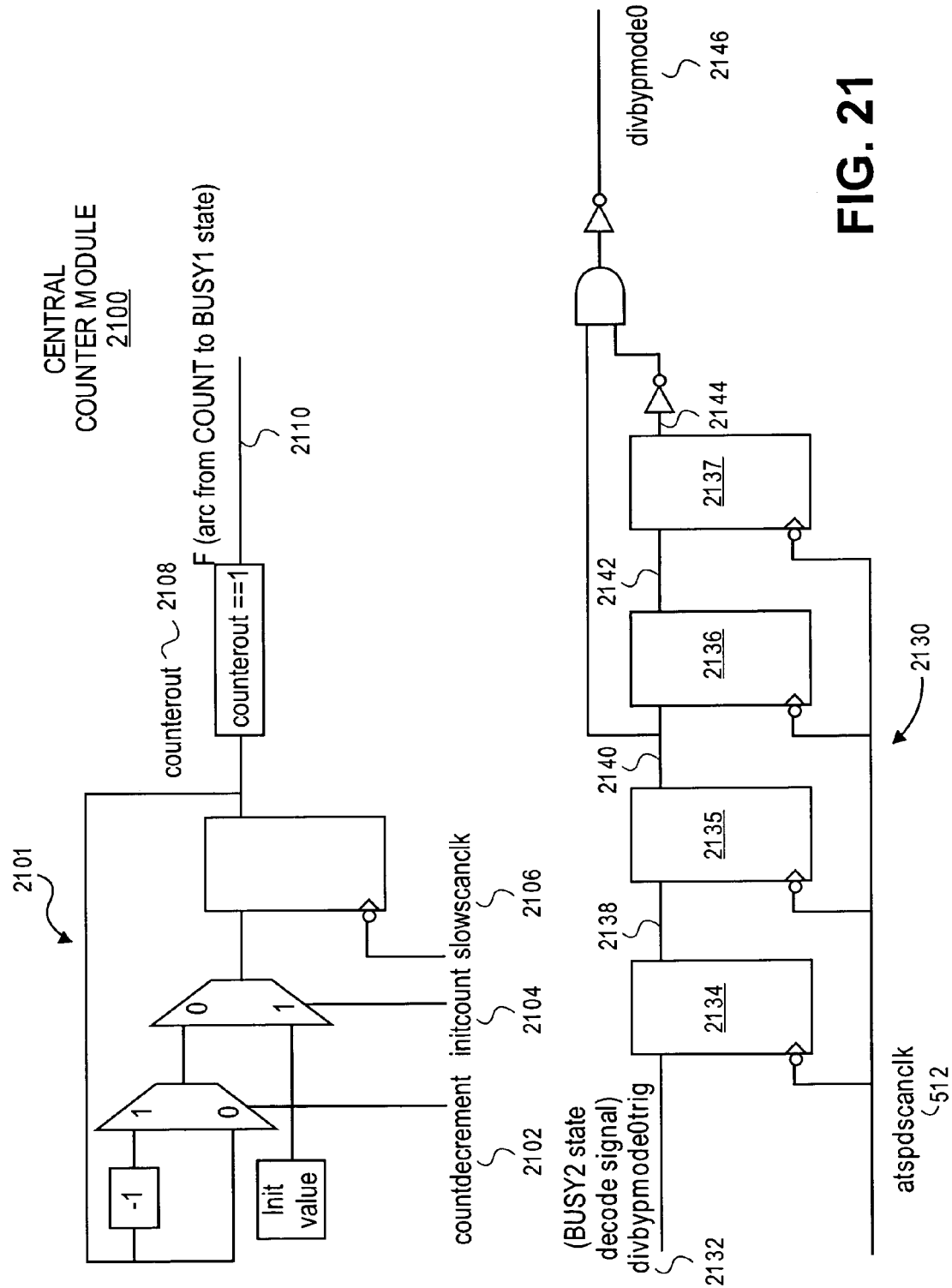
FIG. 21 is a block diagram illustrating one embodiment of a central counter module in accordance with the teachings of the present invention.

Turning to FIGS. 19-21, embodiments of a distributed SS module and a centralized CM that may be used with FSM 1500 are shown. Turning to FIG. 19, an embodiment of a combinatorial at-speed scan tester 1900 is shown. A scan test controller 1902 is connected to a plurality of Distributed Shift Generators (DSGs) 1912-1915. Scan test controller 1902 includes centralized Counter Module (CM) 1910, Master Control FSM 1500 and PLLs 1606 and 1608.

Some of the DSGs and their scan chains are clocked by PLL 1606 (time domain 0), while the remaining DSGs and their scan chains are clocked by PLL 1608 (time domain 1). As described above, the time domains not under test are not restricted to all 1's or all 0's as to the test patterns used in their scan chains.

In embodiments discussed in conjunction with FIGS. 1-14, three separate clock trees (clkout, atspdscanclk, and slowspdscanclk) are distributed through the entire processor 100 and subsequently need to be balanced. Further coordination is needed because the clock multiplex event at the root of the tree coincides with the scancapturewindow at the end of the tree using the same divbypmodetrig event.

In the embodiments of FIGS. 19-21, one signal (divbypmode0trig) is clock-crossed between clock domains. Moreover, one clock tree (clkout) is distributed across the processor for testing.

Scan test controller 1902 is coupled to Distributed Shift Generators (DSGs) 1912-1915. Each DSG is similar to a DSC, but each DSG 1912-1915 contains an SS module, such as SS module 1920, but does not contain a CM module. The countdown process as test patterns are shifted into the scan chains occurs at one central CM; hence, the countdown process has been decoupled from the shift-generation process. In short, each SS module acts as a shift generator that receives a triggering signal from the scan test controller 1902 for enabling the last-shift and capture events of the at-speed test.

Shiften 120 is distributed to each DSG. Each DSG outputs shiften-flops to each of its associated scan chains. Also, the synchronization FFs are centralized at the central CM and are not distributed throughout the chip.

Turning to FIG. 20, an embodiment an SS module 2000 is shown. SS module 2000 will be discussed for domain 0 under test, but it will be understood that SS module 2000 operates similarly for domain 1 under test. In the embodiment of FIG. 20, logic 2005 includes an OR-gate between spdscanmode0 and spdscanmode1 which determines the state of spdscanmode 2001 at SS module 2000. In one embodiment, the logic 2005 is located centrally at scan test controller 1902.

SS module 2000 generates scancapturewindow 2008 as described in earlier embodiments. A tap of scancapturewindow 2008 is shown in FIG. 20. However, in SS module 2000, scancapturewindow 2008 is generated using clkout 524 from PLL 1606 and suppressclk0 2003 coming from FSM 1500. Suppresclk 2003 is balanced with respect to clkout 524. There are no other clocks used at each of the DSGs. Also, suppresclk 2003 acts as a trigger for enabling the internal generation of shiften-flop 2006 for the last-shift event of the domain under test. Suppresclk 2003 is asserted a slowscanclk cycle before divbypmode0trig to give suppressclk0 plenty of time to reach all of the DSGs.

A FF 2004 and associated logic is used to balance suppressclk0 2003 with clkout 524. It is noted that in the embodiment of SS module 2000, FF 2004 is a negative-edge-clocked FF.

The operation of SS module 2000 will now be discussed. The reader may also wish to reference the timing diagrams of FIGS. 17 and 18.

During the CNT state, suppressclk0 is de-asserted. Thus, mux 2010 selects an input of logical '1' that is inputted into FF 2004. FF 2004 continues to hold a logical '1' and consequently asserts scancapturewindow 2008. FF 2004 also sends a logical '1' to AND-gate 2012. At mux 2014, since spdscandmode 02001 is asserted, mux 2014 selects the output of AND-gate 2012. Since AND-gate 2012 is receiving a logical '1' from FF 2004, the state of shiften 120 is sent to the scan chains as shiften-flop 2006.

At BUSY1, suppresclk0 2001 is asserted. Since clkout 524 is suppressed at BUSY1, FF 2004 is no longer being clocked. On the next negative edge of clkout 524, mux 2010 will select the inverted output of FF 2004 which will be a logical '0'.

The activity at the DSGs of the time domain not under test during BUSY1 will now be discussed. During BUSY1, at the DSGs associated with time domain 1, suppressclk1 is still low (see FIG. 17). Thus, at the scan chains of time domain 1, a burninclk 502 pulse is passed to the scan chains as clkout 524. This enables shiften 120 to pass to the scan chains as shiften-flop so that a last shift of the scan chains may occur. At this point, for the scan chains of the domain not under test, the test pattern has been completed shifted into these scan chains.

Returning to time domain 0, at BUSY2, two at-speed pulses are generated at PLL 1606 and distributed to the DSGs as clkout 524. At SS module 2000, the first at-speed pulse is the last shift cycle, and latches a logical '0' at FF 2004. This occurs because mux 2010 outputs a logical '0' which gets latched to FF 2004. Also, on this first at-speed pulse, FF 2004 outputs a logical '1' to AND-gate 2012. Thus, a shiften 120, that is still asserted, is passed to the circuit under test as shiften_flop 2006. Thus, the last-shift (and launch) occurs at the scan chains associated with time domain 0.

At the second at-speed pulse, FF 2004 latches a logical '1' because FF 2004 receives from mux 2010 the inverted output of FF 2004. Also during this second at-speed pulse, the logical '0' output of FF 2004 is sent as scancapturewindow 2008. Thus, scancapturewindow 2008 is de-asserted during the second at-speed pulse. Also, AND-gate 2012 receives a logical '0' which causes AND-gate 2012 to output a logical '0' to mux 2014. Since spdscanmode0 2001 is still asserted, mux 2010 selects the output of AND-gate 2012. Thus, shiften_flop 2006 is de-asserted during this second at-speed pulse. Thus, the second at-speed pulse allows a capture cycle.

Once the external shiften 120 is de-asserted, the state machine transitions back to RDY to get ready to shift in another test vector as the previous test is shifted out of the scan chains. As previously discussed, the timing of the de-assertion of shiften 120 should be made after the at-speed pulses 1720 so to avoid a collision during BUSY2.

During BUSY2 at the time domains not under test, the DSGs do not receive any clkout 524 signals from PLL 1608. Referring to FIG. 5, in time domain 1, since divbypmode1 is always asserted, muxes 518, 520, 522 never select the at-speed pulses. Thus, time domain 1 only receives burninclk (slowscanclk) when suppressclk1 is logical '0'. While the VCO of PLL 1608 continues to generate at-speed pulses for time domain 1, these pulses do not leave PLL 1608 because of muxes 518, 520, 522.

Returning to the domain under test, the shift generation logic of each SS modules is "disabled" during the shift-in events as clocked by slowscanclk. During the slowscanclk clocking of the scan chains, shiften 120 is allowed to reach the scan chains as shiften-flop because of the mux 2014. The shift enable signal is reaching the scan chains from a source external to processor 100 via the external shiften pin of the processor.

When the SS modules are triggered by suppressclk(0 or 1), the SS modules are "enabled" for internal shift generation for at-speed testing. Each SS module asserts and de-asserts shiften-flop as needed for the two at-speed pulses without control external to processor 100. It will also be appreciated that the internal test logic automatically "disables" the SS modules during BUSY2. Thus, at the next test cycle of FSM 1500, the external shiften 120 is again muxed to the scan chains for another shift-in of a test pattern. Thus, the trigger (suppressclk 2003) is automatically shut-off without need of external control. Again, because of no need for external control, the at-speed test scheme described herein may be easily realized with legacy ATPG tools.

In an alternative embodiment, a central CM is not used in generating the trigger (i.e., suppressclk 2003) for SS module 2000, but a trigger signal is sent from an external processor pin. In one embodiment, test software may initiate a trigger signal that is sent to each SS module via the external processor pin. This external trigger would be inputted into the select input of mux 2010.

Turning to FIG. 21, an embodiment of a central CM 2100 is shown. In this embodiment, atspdscanclk 512 and slowscanclk 514 are centralized with Master Control FSM 1500 and are not distributed to the Distributed Shift Generators. Thus, only one timing critical signal (divbypmode0trig) at the central CM 2100 is clock-crossed between slowscanclk and atspdscanclk. Divbypmode0trig is timing critical here because it triggers the generation of divbypmode0 2146 at a synchronization section 2130 which is used to control muxes 518, 520, and 522 at the PLL for the domain under test for the passing of the two at-speed pulses 1710.

A counter circuit 2101 receives countdecrement 2102 and initcount 2104 from FSM 1500, and slowscanclk 2106 from the PLL. Counter circuit 2101 counts down from an initial value to shift in the test vector to the scan chains. When counterout 2108 equals 1, an F arc signal 2110 causes FSM 1500 to change from CNT to BUSY1.

Central CM 2100 also includes the synchronization section 2130 to synchronize divbypmode0trig 2132 produced in the slowscanclk domain with the atspdscanclk domain. Divbypmode0trig 2132 is controlled by FSM 1300. This is in contrast to the embodiments above where each CM outputted a divbymode0trig to each of its respective SS modules. In the embodiments of FIGS. 19-21, one signal (divbypmode0trig) is clock-crossed between two time domains at the central CM.

Divbypmode0trig 2132 is synchronized with atspdscanclk 512 using synchronization FFs 2134-2137. Divbypmode0trig 2132 goes active in the BUSY2 state and is inputted into synchronization FF 2134. Synchronization FF 2134 outputs divbypmode0trigpresync 2138 that is inputted into synchronization FF 2135. Synchronization FF 2135 outputs divbypmode0trigsync 2140. Divbypmode0trigsync 2140 is inputted into synchronization FF 2136. Synchronization FF 2136 outputs divbypmode0trigsyncdelay 12142 that is inputted into synchronization FF 2137. Synchronization FF 2137 outputs divbypmode0trigsyncdelay2 2144. As shown in FIG. 21, FFs 2134-3127 are negative-edge clocked so that divbypmode0trigpresync 2138, divbypmode0trigsync 2140, divbypmode0trigsyncdelay 12142 and divbypmode0trigsyncdelay2 2144 are triggered by the negative edge of atspdscanclk 512.

The synchronization section 2130 generates divbypmode 02146 that is sent to the PLL. As a reminder, divypbmode 02126 being de-asserted and re-asserted defines the window 1708 when the two at-speed pulses will pass to the FFs as clkout 524. In this embodiment, divbypmode0 2146 is located close to the PLL that receives the divbypmode0 signal. In the embodiment of FIG. 11, a divbypmode0 of one of the DSCs was fed back to the PLL for the muxing of the at-speed pulses. The closer proximity of divbypmode to the PLL in the embodiments of FIGS. 19-21 improves system stability. Stability may be improved because divbymode has less distance to travel to reach muxes 518, 520, and 522 at the PLL for selecting the at-speed pulses.

PLL 400 as shown in FIG. 5 may have alternative embodiments when used with the embodiments of FIGS. 19-21. In one embodiment, burninclk 502 maintains an integer ratio to refclk+ 530. In one embodiment, this ratio may be 1:5. As a review, burninclk 502 is used for clocking of slowscanclk 514 and refclk+ 530 is used for clocking of atspdscanclk 512. Synchronization section 2130 of central CM 2100 uses four FFs to cross clock divbymode0trig from the slowscanclk to the atspdscanclk domains. Thus, at least four atspdscanclk cycles are needed between slowscanclk cycles to ensure proper synchronization.

In another alternative embodiment of PLL 400, a PLL feedback may be provided using an atspdscanclk 512 tree tap. This feedback may be used to avoid a collision between the switching of muxes 518, 520 and 522 and divbypmode 516.

Referring to FIG. 5, clkout 524 has an at least one mux delay as compared to atspdscanclk 512 due to muxes 518, 520, 522. Atspdscanclk 512 is used in central CM 2100 to generate divbypmode0 2146. Divbypmode0 2146 is fed back into PLL 400 at divbypmode 516. As a review, divbypmode 516 is used to control muxes 518, 520, 522 to allow the two at-speed pulses to pass to the Distributed Shift Generators as clkout 524. Without feedback, a collision may occur between the switching of muxes 518, 520, 522 and the passage of the two at-speed pulses such that one or both of the at-speed pulses do not get through muxes 518, 520, 522. A tree tap of atspdscanclk 512 may be fed back to PLL 400 so that VCO 526 may be adjusted for proper timing of atspdscanclk 512. Such a feedback may be used to ensure proper sequence of events such that muxes 518, 520, 522 are set by divbypmode 516 before the arrival of the two at-speed pulses.

Turning to FIGS. 22-25, embodiments of controlling the at-speed testing of individual clock trees in the same time domain are shown. In short, a single time domain may be divided into subdomains where each subdomain is associated with a different clock tree. In previous embodiments, clock trees 1x, 2x, and 4x are capturing simultaneously, so each clock tree is receiving the same clock frequency. In these previous embodiments, all clock trees (1x, 2x, and 4x) were receiving the 4x clock frequency and all clock trees 1x, 2x, and 4x were simultaneously performing the at-speed last-shift/capture.

Embodiments in FIGS. 22-25 provide further testing granularity such that a single clock tree in a time domain may be tested at-speed and the remaining clock trees in the same time domain are not at-speed tested. Since only one clock tree is capturing at a time, it is no longer necessary to unify the clock frequencies of the clock trees 1x, 2x, and 4x. Each clock tree 1x, 2x, 4x may capture at its native frequency.

Figure 22:
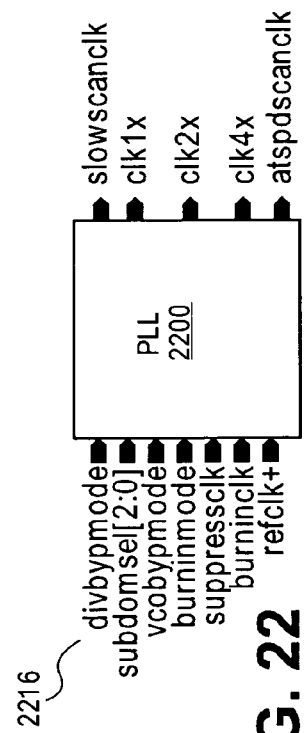
FIG. 22 is a block diagram illustrating one embodiment of a PLL in accordance with the teachings of the present invention.

For example, in FIG. 22, the time domain under test may include three asynchronous clock trees (clk1x 2208, clk2x 2210, and clk4x 2212). For the sake of this example, assume clock tree 1x is under the at-speed test and clock trees 2x and 4x are not under the at-speed test. In order to maintain testing integrity, the scan chains of all clock trees receive all of the shift pulses. However, only clock tree 1x being tested at-speed receives the capture pulse. The capture pulse is masked from reaching clock trees 2x and 4x by the PLL at the roots of the clock trees.

Figure 23:
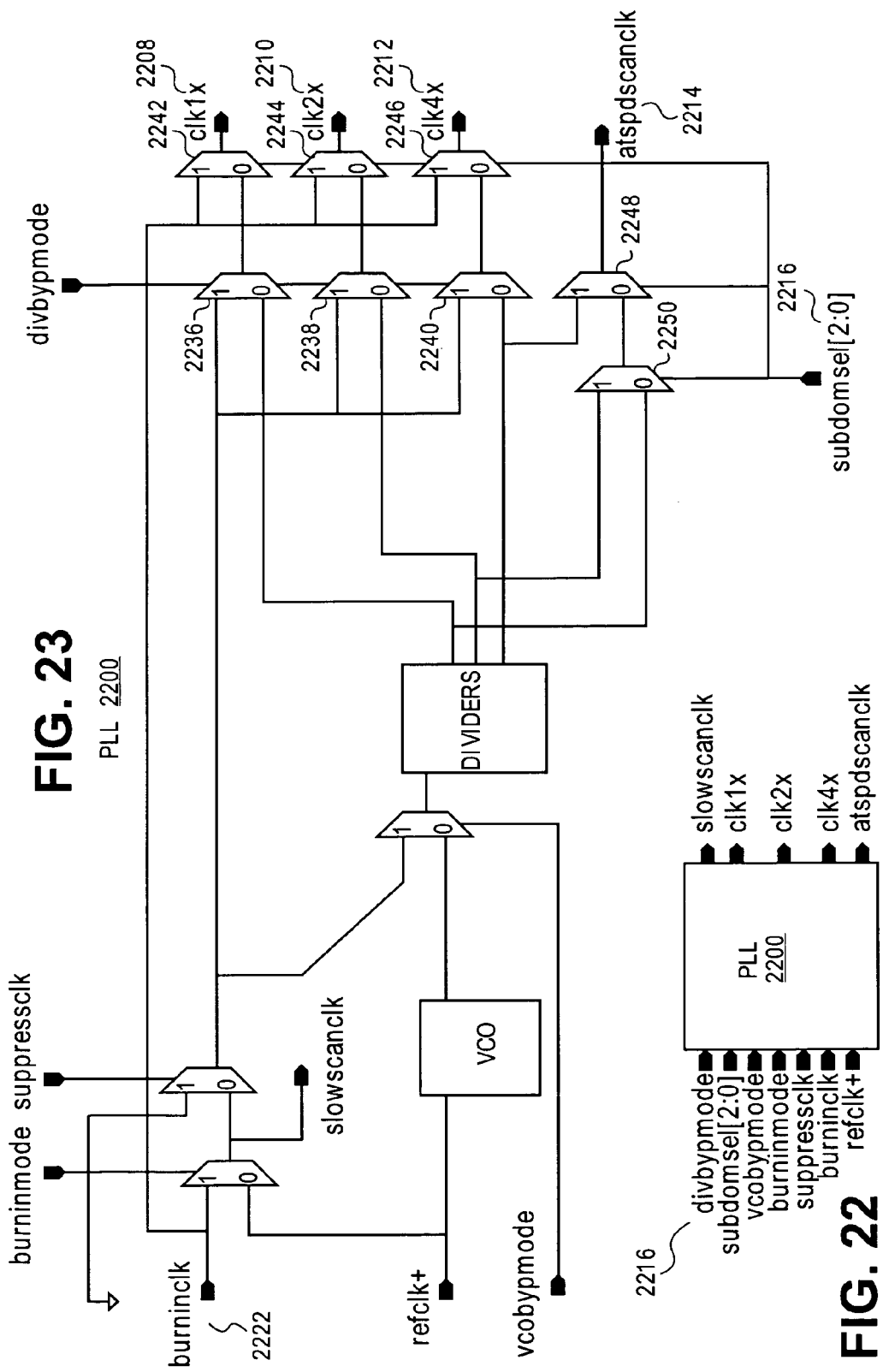
FIG. 23 is a block diagram illustrating one embodiment of a PLL in accordance with the teachings of the present invention.

Turning to FIGS. 22 and 23, an embodiment of a PLL 2200 is shown. PLL 2200 is similar to PLL 400 discussed above with the following differences. In PLL 2200, the spdscanmode pin has been replaced with a three pin subdomain select (subdomsel[2:0] 2216). In one embodiment, subdomsel 2216 may include internal strap configuration bits since the bits are set once at the beginning of a test.

Also, the muxes 504 and 506 coupled to spdscanmode have been removed from PLL 2200. Muxes 2242, 2244, and 2246 have been added as well as muxes 2248 and 2250. Muxes 2242, 2244, 2246 provide for selecting which clock tree will receive the at-speed clock pulse. Muxes 2242, 2244, 2246 are selected using the 3-bit subdomsel 2216 input.

Subdomsel 2216 may input signals for at least five cases: capture on clock tree 1x, capture on clock tree 2x, capture on clock tree 4x, capture on all clock trees, disable all clock trees. The "capture on all clock trees" selection (similar to spdscanmode being asserted in PLL 400 of FIG. 5) corresponds to embodiments above where all the clock trees are capturing at-speed at the same time for the same clock frequency. The "disable all clock trees" selection (similar to spdscanmode being de-asserted in PLL 400 of FIG. 5) is used when the time domain is not under test, so consequently, none of the clock trees within that time domain are tested at-speed.

Muxes 2248 and 2250 are used to determine which at-speed clock frequency is to be tapped for output as atspdscanclk 2214. Since each clock tree 1x, 2x, and 4x may receive its own clocking "at-speed" frequency, the appropriate at-speed clocking frequency must be tapped for use with the synchronization FFs, such as in synchronization section 2130. The select of muxes 2248 and 2250 is received from subdomsel 2216. In one embodiment, 2-bits of the 3-bit subdomsel 2216 input may be tapped as desired to control muxes 2248 and 2250.

Also in PLL 2200, burninclk 2222 is provided to muxes 2242, 2244, 2246. Burninclk 2222 (i.e., the slow speed clock) is provided to the clock trees not capturing. The clock trees not being at-speed tested still need to receive a last-shift pulse to maintain testing integrity across all the clock trees in the time domain under test. Referring to FIG. 18, one slowscanclk (burninclk) pulse occurs during BUSY2. This one slowscanclk pulse is the last-shift pulse for the clock trees not under test within the time domain under test.

Thus, for the clock tree under the at-speed test, the selection of the slow speed or at-speed clock still occurs using divbymode and muxes 2236, 2238, 2240. The clock trees not under test will be clocked by burninclk 2222. The layer of muxes 2242, 2244, 2246 determine which clock tree is the clock tree under test.

In one embodiment of PLL 2200, subdomsel 2216 inputs do not require additional primary input pins on the processor. Subdomsel 2216 may be set by internal logic. Also, subdomsel 2216 may be set early during test initialization, as may spdscanmode in PLL 400, so there are no critical timing requirements for setting subdomsel 2216.

Referring to FIGS. 24-25, an embodiment of a PLL 2400 is shown. In PLL 2400, an additional pin is provided for an internal shift clock (ishftclk) 2402. Ishftclk 2402 may be used for the clocking of the clock trees not under test instead of burninclk 2404. In previous embodiments, refclk+ 2406 and burninclk 2404 are receiving the same clocking signal that is used as the slow speed clock. VCO 2408 uses refclk+ 2406 for generating the highest at-speed clock frequency. However, VCO 2408 may not tolerate the clock frequency of refclk+ 2406 (i.e., the slow speed clock). In PLL 2400, VCO 2408 receives its own independent supply clock from refclk+ 2406. Thus, a different clock input is needed for the slow scan clock for the clock trees.

In PLL 2400, ishftclk 2402 is provided to muxes 2410, 2412, 2414, instead of burninclk 2222 as shown in FIG. 23. Ishftclk 2402 provides the slow scan clock for the time domains. Therefore, one additional external processing pin is needed to provide the slow scan clock to ishftclk 2402 since refclk+ 2406 is devoted to providing the reference for VCO 2408.

Embodiments of the present invention combine the launch-off-shift and broadside techniques. Testers may use legacy ATPG tools to produce efficient combinatorial test patterns, similarly as to launch-off-shift. However, as with the broadside technique, the test pattern is shifted in at slow speed, while the launch and capture events are conducted at-speed by an internal clock. Thus, the advantages of the broadside technique are folded into launch-off-shift. This may provide large functional at-speed coverage while reducing unnecessary yield loss. Embodiments herein add scalability for future faster processors and offer debug capability for present designs due to at-speed clock control.

Figure 26:
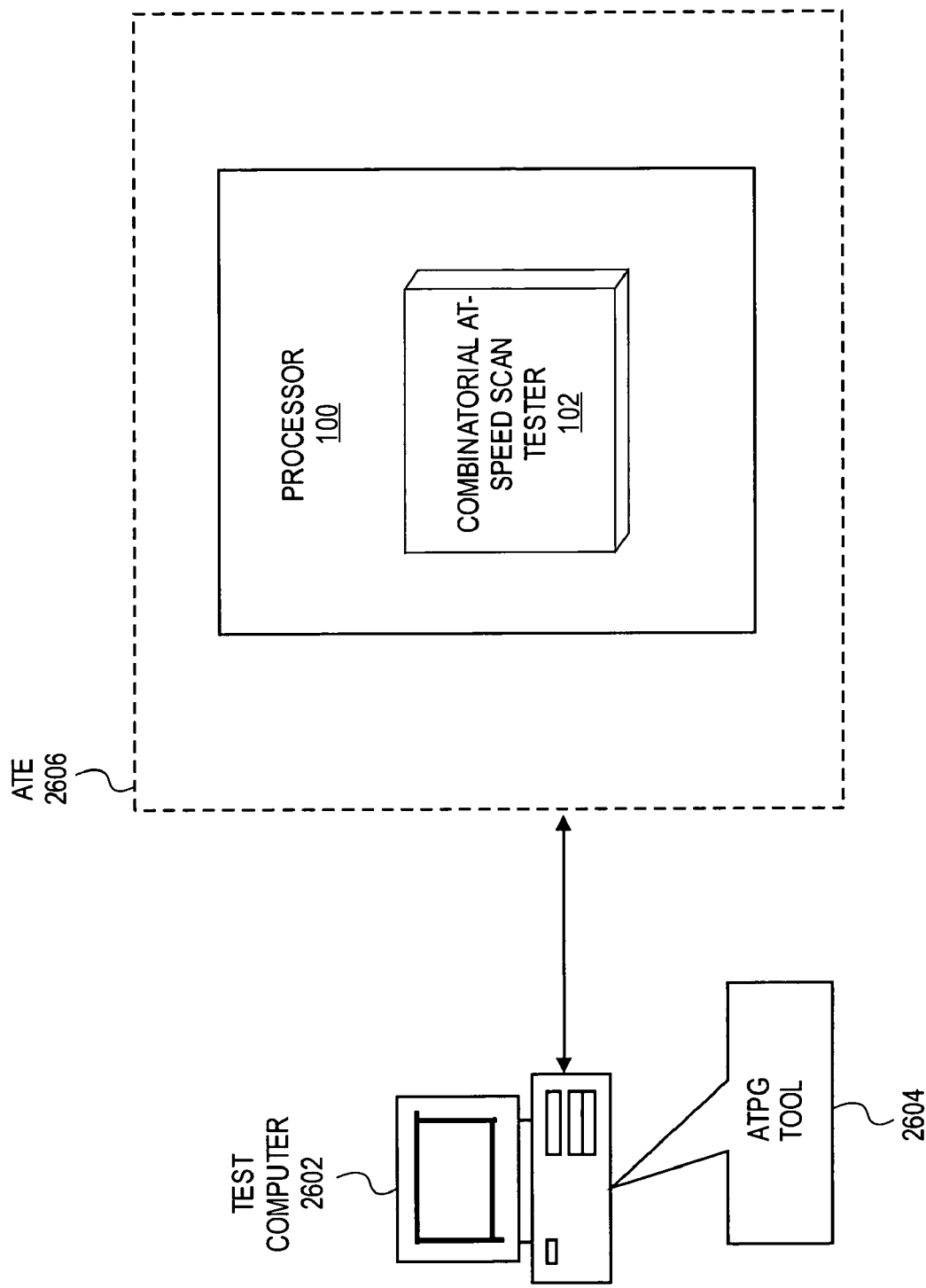
FIG. 26 is a block diagram illustrating one embodiment of a combinatorial at-speed testing system in accordance with the teachings of the present invention.

FIG. 26 illustrates one embodiment of a testing system in accordance with one embodiment of the present invention. The testing system includes a test computer 2602 coupled to automatic test equipment (ATE) 2606 via a wired connection, a wireless connection, over a network, or any combination thereof. ATE 2606 includes a socket, or other coupling device, for receiving processor 100.

Test computer 2602 includes a processor and a memory device. Test computer 2602 may also include storage, non-volatile storage (NVS), network interface, and Input/Output (I/O) devices, such as a keyboard and mouse. Test computer 2602 may also include an ATPG tool 2604, such as, for example, FASTSCAN®, TetraMAX®, or the like. In one embodiment, ATPG tools may be used to generate ATPG vectors with a sequential depth setting of zero.

Test computer 2602 executes ATPG tool 2604 to test processor 100 using combinatorial at-speed scan tester 102. ATPG vectors are sent to tester 102 via ATE 2606 for testing processor 100. The results of the testing are collected and stored at test computer 2602 by ATPG tool 2604.

The above description of illustrated embodiments of the invention, including what is described in the Abstract, is not intended to be exhaustive or to limit the embodiments to the precise forms disclosed. While specific embodiments of, and examples for, the invention are described herein for illustrative purposes, various equivalent modifications are possible, as those skilled in the relevant art will recognize. These modifications can be made to embodiments of the invention in light of the above detailed description. The terms used in the following claims should not be construed to limit the invention to the specific embodiments disclosed in the specification. Rather, the following claims are to be construed in accordance with established doctrines of claim interpretation.

What is claimed is:

1. A processor, comprising:
   a first distributed shift generator associated with a first time domain, wherein the first distributed shift generator is coupled to a first group of scan chains, the first distributed shift generator to send a shift-enable-flop signal to be received by the first group of scan chains;
   a second distributed shift generator associated with a second time domain, wherein the second distributed shift generator is coupled to a second group of scan chains, the second distributed shift generator to send a shift-enable-flop signal to be received by the second group of scan chains; and
   a scan test controller coupled to the first and second distributed shift generators, the scan test controller to provide clocking signals for the first time domain and the second time domain for performing an at-speed test of circuits coupled to the first group of scan chains.

2. The processor of claim 1 wherein in the shift-enable-flop signal is based on an external shift-enable signal when shifting in a portion of a first test pattern into the first group of scan chains, wherein the first time domain is under test.

3. The processor of claim 2 wherein a second test pattern is shifted into the second group of scan chains while the first test pattern is shifted into the first group of scan chains, wherein the second time domain is not under test.

4. The processor of claim 3 wherein the scan test controller includes:
   a master control finite state machine;

a first phase-locked loop coupled the master control finite state machine, the first phase-locked loop to generate at-speed clock pulses for the first time domain;

a second phase-locked loop coupled to the master control finite state machine, the second phase-locked loop to generate at-speed clock pulses for the second time domain; and a central counter module coupled to the master control finite state machine, the central counter module to send a trigger signal to the first distributed shift generator to enable generation of an internal shift-enable signal at the first distributed shift generator.

5. The processor of claim 4 wherein the central counter module includes:

a counter for determining when the trigger signal is to be sent to the first distributed shift generator.

6. The processor of claim 4 wherein central counter module includes:

a synchronization section to issue a bypass control signal to the first phase-locked loop to allow two at-speed pulses to be forwarded to the first group of scan chains.

7. The processor of claim 4 wherein the master control finite state machine includes:

a first busy state to preclude a last-shift of the first group of scan chains of the first time domain and to allow a last-shift of the second group of scan chains of the second time domain; and a second busy state to allow two at-speed clock pulses associated with a launch and a capture event, respectively, of each scan chain of the first group of scan chains.

8. The processor of claim 1, further comprising an external trigger pin to provide a trigger signal to the first distributed shift generator to enable generation of an internal shift-enable signal at the first distributed shift generator.

9. A system, comprising:

an Automatic Test Pattern Generation (ATPG) tool; and a processor including an at-speed scan tester coupled to the ATPG tool, the combinatorial at-speed scan tester including:

a first distributed shift generator associated with a first time domain, wherein the first distributed shift generator is coupled to a first group of scan chains, the first distributed shift generator to send a shift-enable-flop signal to be received by the first group of scan chains;

a second distributed shift generator associated with a second time domain, wherein the second distributed shift generator is coupled to a second group of scan chains, the second distributed shift generator to send a shift-enable-flop signal to be received by the second group of scan chains; and a scan test controller coupled to the first and second distributed shift generators, the scan test controller to provide clocking signals for the first time domain and the second time domain for performing an at-speed test of circuits coupled to the first group of scan chains, wherein the scan test controller includes:

a master control finite state machine;

a first phase-locked loop coupled the master control finite state machine, the first phase-locked loop to generate at-speed clock pulses for the first time domain;

a second phase-locked loop coupled to the master control finite state machine, the second phase-locked loop to generate at-speed clock pulses for the second time domain; and a central counter module coupled to the master control finite state machine, the central counter module to send a trigger signal to the first distributed shift generator to enable generation of an internal shift-enable signal at the first distributed shift generator.

10. The system of claim 9 wherein in the shift-enable-flop signal is based on an external shift-enable signal initiated by the ATPG tool when shifting in a portion of a first test pattern into the first group of scan chains, wherein the first time domain is under test.

11. The system of claim 10 wherein a second test pattern is shifted into the second group of scan chains while the first test pattern is shifted into the first group of scan chains, wherein the second time domain is not under test.

12. A method, comprising:

shifting in a portion of a first test pattern into a first group of scan chains of a first time domain using a slow-speed clock, wherein shifting in the portion of the first test pattern includes shifting in the first test pattern to a next-to-last flip-flop in each scan chain of the first group of scan chains based on an external shift-enable signal;

shifting in the second test pattern into a second group of scan chains of a second time domain using the slow-speed clock; and performing an at-speed test of circuits coupled to the first group of scan chains using an at-speed clock in the first time domain.

13. The method of claim 12 wherein shifting in the second test pattern includes:

shifting in the second test pattern into the second group of scan chains based on an external shift-enable signal before the last-shift occurs in the first group of scan chains.

14. A method, comprising:

shifting in a portion of a first test pattern into a first group of scan chains of a first time domain using a slow-speed clock;

shifting in the second test pattern into a second group of scan chains of a second time domain using the slow-speed clock; and performing an at-speed test of circuits coupled to the first group of scan chains using an at-speed clock in the first time domain wherein performing the at-speed test includes:

performing a last-shift using the at-speed clock, wherein the last-shift is based on an internally generated shift-enable signal, and capturing the at-speed test using the at-speed clock.

15. The method of claim 14 wherein the first time domain includes a first clock tree and a second clock tree, wherein the last-shift and the capture are performed using the first clock tree, wherein the last-shift is performed using the second clock tree and the capture is masked from the second clock tree.

16. The method of claim 14 wherein the internally generated shift-enable signal is generated at a first distributed shift generator coupled to the first group of scan chains.

17. The method of claim 16, further comprising enabling the generation of the internally generated shift-enable signal using a trigger signal sent from a scan test controller coupled to the distributed shift generator.

18. The method of claim 16, further comprising using a decrementing counter at the scan test controller to determine when the trigger signal is sent to the first distributed shift generator.

19. A method, comprising:
   shifting in a portion of a first test pattern into a first group of scan chains of a first time domain using a slow-speed clock;
   shifting in the second test pattern into a second group of scan chains of a second time domain using the slow-speed clock;
   performing an at-speed test of circuits coupled to the first group of scan chains using an at-speed clock in the first time domain; and
   generating at-speed clock pulses for the first time domain using a first phase-locked loop, wherein the first phase-locked loop is on-board the processor.

* * * * *